(12) United States Patent
Elsherbini et al.

(10) Patent No.: US 11,694,986 B2
(45) Date of Patent: Jul. 4, 2023

(54) VIAS IN COMPOSITE IC CHIP STRUCTURES

(71) Applicant: Intel Corporation, Santa Clara, CA (US)

(72) Inventors: Adel Elsherbini, Tempe, AZ (US); Patrick Morrow, Portland, OR (US); Johanna Swan, Scottsdale, AZ (US); Shawna Liff, Scottsdale, AZ (US); Mauro Kobrinksy, Portland, OR (US); Van Le, Beaverton, OR (US); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/500,824

(22) Filed: Oct. 13, 2021

(65) Prior Publication Data
US 2022/0037281 A1     Feb. 3, 2022

Related U.S. Application Data

(62) Division of application No. 16/586,158, filed on Sep. 27, 2019, now Pat. No. 11,205,630.

(51) Int. Cl.
*H01L 23/00*     (2006.01)
*H01L 23/528*     (2006.01)
(Continued)

(52) U.S. Cl.
CPC ........ *H01L 24/24* (2013.01); *H01L 21/76898* (2013.01); *H01L 21/82* (2013.01);
(Continued)

(58) Field of Classification Search
CPC ..... H01L 25/0657; H01L 25/18; H01L 24/24; H01L 24/82; H01L 21/76898;
(Continued)

(56) References Cited

U.S. PATENT DOCUMENTS 8,584,061 B2    11/2013   Shibata et al.
9,219,042 B2    12/2015   Paek et al.
(Continued)

OTHER PUBLICATIONS

Non-Final Office Action for U.S. Appl. No. 16/586,145, dated Oct. 29, 2020.
(Continued)

*Primary Examiner* — Joseph C. Nicely
(74) *Attorney, Agent, or Firm* — Essential Patents Group, LLP

(57) ABSTRACT

A composite integrated circuit (IC) device structure comprising a host chip and a chiplet. The host chip comprises a first device layer and a first metallization layer. The chiplet comprises a second device layer and a second metallization layer that is interconnected to transistors of the second device layer. A top metallization layer comprising a plurality of first level interconnect (FLI) interfaces is over the chiplet and host chip. The chiplet is embedded between a first region of the first device layer and the top metallization layer. The first region of the first device layer is interconnected to the top metallization layer by one or more conductive vias extending through the second device layer or adjacent to an edge sidewall of the chiplet.

19 Claims, 24 Drawing Sheets

(51) Int. Cl.
  *H01L 23/522* (2006.01)
  *H01L 25/18* (2023.01)
  *H01L 25/00* (2006.01)
  *H01L 21/768* (2006.01)
  *H01L 21/82* (2006.01)
  *H01L 23/48* (2006.01)
  *H01L 25/065* (2023.01)

(52) U.S. Cl.
  CPC .......... *H01L 23/481* (2013.01); *H01L 23/528* (2013.01); *H01L 23/5226* (2013.01); *H01L 24/05* (2013.01); *H01L 24/08* (2013.01); *H01L 24/09* (2013.01); *H01L 24/82* (2013.01); *H01L 25/0657* (2013.01); *H01L 25/18* (2013.01); *H01L 25/50* (2013.01); *H01L 2224/0557* (2013.01); *H01L 2224/06181* (2013.01); *H01L 2224/08145* (2013.01); *H01L 2224/09181* (2013.01); *H01L 2224/24147* (2013.01); *H01L 2224/24155* (2013.01)

(58) Field of Classification Search
  CPC ... H01L 21/82; H01L 23/481; H01L 23/5226; H01L 23/528; H01L 2224/24155
  See application file for complete search history.

(56) References Cited

U.S. PATENT DOCUMENTS

| | | | |
|---|---|---|---|
| 9,275,929 | B2 | 3/2016 | Liou et al. |
| 9,324,698 | B2 | 4/2016 | Yu et al. |
| 9,368,479 | B2 | 6/2016 | Katkar et al. |
| 9,418,967 | B2 | 8/2016 | Koshiishi et al. |
| 9,570,399 | B2 | 2/2017 | Yang et al. |
| 9,589,945 | B2 | 3/2017 | Jo et al. |
| 9,978,694 | B2 | 5/2018 | Cho et al. |
| 10,026,715 | B2 | 7/2018 | Kume et al. |
| 10,276,544 | B2 | 4/2019 | Matsumoto et al. |
| 10,347,598 | B2 | 7/2019 | Baek et al. |
| 10,510,650 | B2 | 12/2019 | Yu et al. |
| 11,094,672 | B2 | 8/2021 | Elsherbini et al. |
| 2008/0246126 | A1 | 10/2008 | Bowles et al. |
| 2015/0200153 | A1 | 7/2015 | Wang et al. |
| 2017/0207197 | A1 | 7/2017 | Yu et al. |
| 2019/0051612 | A1 | 2/2019 | Kim et al. |
| 2019/0103390 | A1* | 4/2019 | Chen .................. H01L 25/074 |
| 2019/0393190 | A1 | 12/2019 | Delacruz et al. |
| 2020/0185330 | A1 | 6/2020 | Yu et al. |
| 2020/0312774 | A1 | 10/2020 | Yu et al. |
| 2021/0098422 | A1 | 4/2021 | Elsherbini et al. |
| 2021/0375830 | A1 | 12/2021 | Elsherbini |

OTHER PUBLICATIONS

Non-Final Office Action for U.S. Appl. No. 16/586,158, dated May 5, 2021.
Notice of Allowance for U.S. Appl. No. 16/586,145, dated Apr. 21, 2021.
Notice of Allowance for U.S. Appl. No. 16/586,158, dated Aug. 26, 2021.
Notice of Allowance for U.S. Appl. No. 16/586,167, dated Jan. 15, 2021.
Office Action for U.S. Appl. No. 17/399,185, dated Sep. 30, 2022.
Jani, I., et al., "Innovative structures to test bonding alignment and characterize high density interconnects in 3D-IC", 15th IEEE International New Circuits and Systems Conference (NEWCAS), 2017, pp. 153-156.

* cited by examiner

VIAS IN COMPOSITE IC CHIP STRUCTURES

CLAIM OF PRIORITY

This application is a Divisional of, and claims the benefit of priority to U.S. patent application Ser. No. 16/586,158, filed Sep. 27, 2019, titled "VIAS IN COMPOSITE IC CHIP STRUCTURES", which is incorporated by reference in its entirety for all purposes.

CROSS REFERENCE TO RELATED APPLICATIONS

This application is related to U.S. patent application Ser. No. 16/586,145, filed on Sep. 27, 2019, entitled "COMPOSITE IC CHIPS INCLUDING A CHIPLET EMBEDDED WITHIN METALLIZATION LAYERS OF A HOST IC CHIP", and to U.S. patent application Ser. No. 16/586,167, filed Sep. 27, 2019, entitled "PACKAGED DEVICE WITH A CHIPLET COMPRISING MEMORY RESOURCES".

BACKGROUND

Monolithic silicon fabrication methods may result in certain restrictions of device architecture that may limit the performance of the final product. Heterogeneous integration where independently fabricated dies are integrated within the same package (according to multi-chip packaging, wafer stacking, or die stacking techniques) may suffer high fabrication costs, lower insertion efficiencies, and large z-heights.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only. Views labeled "cross-sectional", "profile", "plan", and "isometric" correspond to orthogonal planes within a Cartesian coordinate system. Thus, cross-sectional and profile views are taken in the x-z plane, plan views are taken in the x-y plane, and isometric views are taken in a 3-dimensional Cartesian coordinate system (x-y-z). Where appropriate, drawings are labeled with axes to indicate the orientation of the figure.

DETAILED DESCRIPTION

Figure 1A:
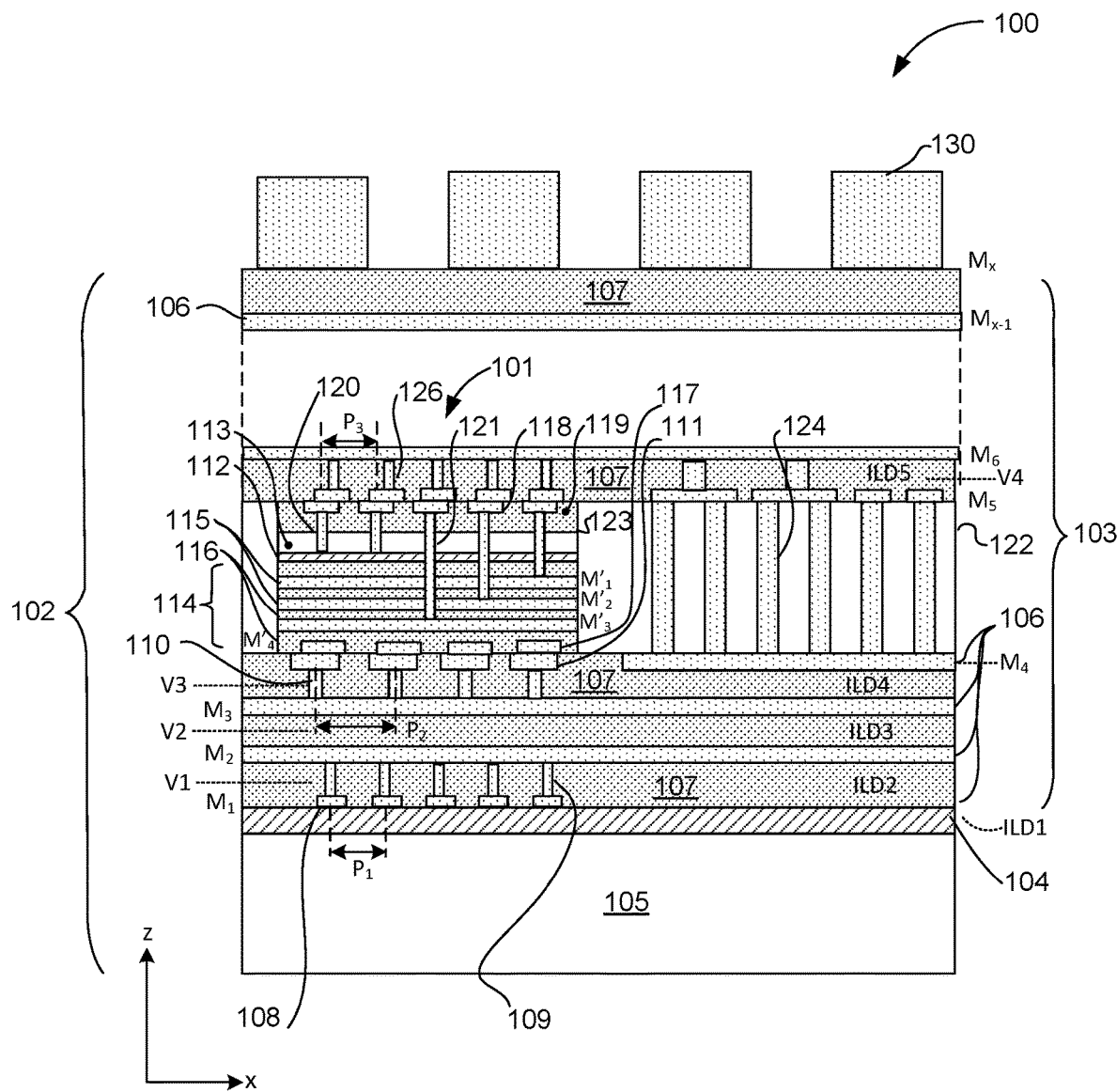
FIG. 1A illustrates a cross sectional view in the x-z plane of a composite chip structure, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

Here, the term "back end of the line (BEOL) generally refers to post-device fabrication operations on a semiconductor wafer. After formation of the active and passive devices within a circuit layer on the semiconductor wafer in a front-end of the fabrication line (e.g., front-end-of-the line or FEOL), a series of operations where metal features are formed (metallization) over the semiconductor devices comprise the BEOL portion of the fabrication line.

Here, the term "chiplet" generally refers to a small, thin die embedded in the BEOL metallization of a larger host die. In the described embodiments, chiplets share metallization levels with the host die, and may share dielectric materials. Chiplets may carry specialized integrated circuits, for example, clocking circuits, active repeater banks for long-distance on-die interconnects, etc.

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is an integrated circuit device structure comprising small embedded chips (dies) within metallization levels on a host chip (die). The small chips, hereinafter referred to as chiplets, are embedded within a multi-level metallization stack on the host chip and function as auxiliary integrated circuits that perform functions with the host chip. The resulting composite structure may be handled as a monolithic composite chip and assembled into a package using standard package assembly tools and procedures. In some embodiments, one or more chiplets are embedded at lower metallization levels, proximal to the active layer of the host chip.

A composite IC chip architecture enables high density interconnection between chiplet and host chip, as the chiplet may be incorporated into the metallization stack close to the active layer of the host chip. In some embodiments, the chiplet may be directly bonded to the host chip, for example by hybrid bonding, where fine-pitch interconnect structures on both chiplet and host chip are directly bonded together by metal interdiffusion.

The chiplet(s) may be partially or fully fabricated separately from the host chip. Partially or completely fabricated chiplets may be singulated from a wafer, and placed on the host chip wafer by a pick-and-place operation at a particular stage of BEOL metallization. Any alignment imprecision for fine features that result may be compensated by including a metallization stack on the chiplets, where feature pitch increases from inner (lower) to outer (upper) metallization levels. Coarser features in an outermost metallization level of the chiplet may match feature pitches on an outermost metal level on the host chip, allowing some degree of offset between chiplet and host die interconnect features.

Signal and power to circuitry on host chip that is directly under the chiplet(s), may be routed through conductive vias that extend through the device layer of the chiplet. These vias may interconnect frontside and backside metallization of the chiplet, and may improve delivery of power and input/output (I/O) signals to circuit on the host chip shadowed by the chiplet. In some embodiments, through-chiplet vias extend through the device layer of the chiplet (e.g., through-device layer vias, TDVs). TDVs may be formed in the chiplets at wafer level before singulation and attachment on the host die. In alternative embodiments, TDVs may be formed in the individual chiplets in a post-attach process. Direct vertical routing enabled by the TDVs may reduce parasitic loss for both power and high-speed data signals routed throughout the composite IC chip.

Depending on the type and density of circuitry within the active layer on the chiplet(s) and host die, embodiments of TDVs may have relatively small or large cross-sections. As an example, a chiplet may comprise a high-density device layer comprising a high-density array of transistors, where transistor gate terminals may have feature pitches ranging between 50 and 100 nm. TDVs extending through the device layer of the chiplet may reduce the active device density within the active layer of the chiplet by excluding formation of transistors or passive structures such as metal features within a perimeter that surrounds the individual vias, referred to as a keep-out zone. To minimize impact on the device density of the chiplets, TDVs may have diameters ranging between 50 and 1000 nm (generally sub-micron). Sub-micron via diameters may be realized by thinning the bulk semiconductor material of the chiplet to a few microns prior to forming the through-chiplet vias by etching and chemical deposition processes.

For small numbers of through-connections, large through-chiplet vias (e.g., having diameters larger than 1000 nm) may be fabricated through a chiplet device layer with minimal disruption of a device layer that has relatively low transistor densities. Large-diameter through-chiplet vias may allow for a significant degree of chiplet misalignment.

Large vias may also be fabricated around the chiplet instead of through it. Such "cantilevered" vias may be formed as vertical routing planes within the host chip back-end-of-the-line (BEOL) metallization layers. The cantilevered vias may be immediately adjacent to the sidewalls of the chiplet to minimize conductor length and therefore signal path resistance. Cantilevered vias may be fabricated as rectangular pillars adjacent to the sidewalls of the chiplet, where the rectangular cantilevered vias extend along the lateral and vertical dimensions of the sidewalls, and outwardly from the chiplet sidewalls a distance covering up to several microns, forming a relatively thick, continuous metal (e.g., copper) sheet. The cantilevered vias may couple to metallization levels above and below the chiplet. In some embodiments, the cantilevered vias may couple to chiplet metallization levels in addition to host chip metallization levels. The cantilevered vias may provide improved power delivery over through-chiplet vias, as the thick continuous sheets of metal may have significantly less electrical resistance than small diameter vias. Larger power levels may then to be coupled to the host chip.

FIG. 1A illustrates a cross sectional view in the x-z plane of composite chip structure 100, according to some embodiments of the disclosure.

Composite chip structure 100 comprises chiplet 101 integrated on host chip 102. Host chip 102 comprises a BEOL metallization level stack 103 on device layer 104 over substrate 105. In some embodiments, device layer 104 and substrate 105 comprise semiconductor materials such as, but not limited to silicon (Si), germanium (Ge), silicon germanium (SiGe), gallium arsenide (GaAs), gallium phosphide (GaP), gallium nitride (GaN), gallium indium nitride (GaInN), or indium phosphide (InP). In some embodiments, substrate 105 is a silicon on insulator (SOI) chip, having a buried oxide (BOX) layer several microns below the surface. Device layer 104 may be formed in the semiconductor material above the BOX layer. Device layer 104 may have a thickness ranging up to 100 to 1000 nm, and is integral with substrate 105, which may have a thickness ranging up to 500 microns.

Host chip BEOL metallization levels 103 comprise a stack of one or more conductive layers 106 interleaved between multiple dielectric layers 107. A first conductive layer 106 (M1) is proximal to device layer 104. Features within M1 may be interconnected to components (e.g., transistor terminals) within device layer 104 through vias extending through a first interlayer dielectric layer (ILD1). In the illustrated example, ILD2 is above M1, and is the first ILD of BEOL stack 103.

In some embodiments, conductive layers 106 comprise metals such as, but not limited to, copper, copper-aluminum alloy, aluminum, silver, gold, nickel, indium, and tungsten, cobalt, tungsten, tantalum, and titanium. Interlayer dielectric (ILD) layers 107 comprise materials such as, but are not limited to, silicon oxides (e.g., $Si_xO_{1-x}$), silicon nitrides (e.g., $Si_xN_{(1-x)}$), silicon oxynitrides (e.g., $SiO_xN_{(1-x)}$), silicon carbide (e.g., SiC) and silicon carbide nitrides (e.g., $SiC_xN_{1-x}$), aluminum oxides, and aluminum nitrides. In some embodiments, ILD layers 107 comprise low-k materials having a relative permittivity below that of $SiO_2$ (e.g., $k \leq 3.9$). ILD layer(s) 107 may comprise any of the above materials or a silicate glass, such as, but not limited to, fluorosilicate glass (FSG), phosphosilicate glass (PSG), borophosphosilicate glass (BSG) or undoped silicate glass (USG), organosilicate glass (OSG—e.g., carbon-doped oxide, CDO) porous OSG, and porous silicon dioxide. In some embodiments, one or more of ILD layers 107 may comprise low-k organic polymeric materials such as polyimides, hydrogen silsesquioxane and methyl silsesquioxane. The above dielectric materials may be formed by spin coating methods (e.g., spin-on glass, SOG), chemical vapor deposition (CVD) or sol gel techniques.

In some embodiments, host chip device layer 104 comprises active devices, passive devices or a combination of active and passive devices. Active devices may include arrays of field-effect (FET) or bipolar junction transistors arranged in logic circuits. Feature pitches, defined as distances between like interconnect terminals over gate, source or drain regions of individual transistors may range between 40 and 1000 nanometers (nm). For example, gate-to-gate pitches may be between 40-80 nm. A first metallization level M1 of the BEOL stack comprises interconnect features 108 coupled to gate, source and drain terminals. Interconnect features 108 have a pitch P1 that may range, for example, between 40 to 1000 nm. BEOL M1 interconnect features 108 are coupled to a higher conductive level M2 through interlayer vias 109 in via level V1. In the illustrated embodiment, four BEOL conductive layers 106, designated as metallization levels M1-M4, are shown below chiplet die 101, but chiplet die 101 may be attached at any suitable level within BEOL metallization stack 103.

Layer thicknesses for both conductive layers 106 and dielectric layers 107 may range from 50 nm in the lower levels proximal to substrate 105, to 5 microns, or more, in the upper levels near the top of the BEOL metallization levels 103. Features within the conductive layers 106 may be pads and traces (e.g., pads 111) that interconnect pads within a conductive level 106. Interlevel vias, similar to interlayer vias 109 may extend through dielectric layers 107 between higher conductive levels 106 and interconnect pads in adjacent levels 106. Interlevel via levels are indicated as V1, V2, etc., in the figure and are coincident with ILD layers 107 In some embodiments, minimum feature size and pitch increases with increasing distance from device layer 104. Upper-most metallization levels (e.g., levels highest in the stack) may have the largest pitches, indicated by pitch P2 (greater than P1). In the illustrated embodiment, interlayer vias 110 have a pitch P2, interconnecting upper-most conducive level M4, comprising pads 111 to adjacent lower level M3.

Chiplet 101 comprises device layer 112 over the front side of chiplet semiconductor base 113. In some embodiments, chiplet semiconductor device layer 112 and base 113 comprises a semiconductor material such as, but not limited to, silicon (Si), germanium (Ge), silicon germanium (SiGe), gallium arsenide (GaAs), gallium phosphide (GaP), gallium nitride (GaN), gallium indium nitride (GaInN), or indium phosphide (InP). In some embodiments, chiplet base 113 has a thickness of less than 10 microns. In some embodiments, chiplet base 113 comprises a BOX.

Device layer 112 may comprise transistors and passive devices. Metallization within device layer 112 comprise transistor gate, source and drain terminals directly on the semiconductor devices. Device layer metallization may also comprise passive device terminals. Vias may extend from terminal metallization on through a first ILD (not shown) to metallization features (e.g., pads and traces) in metallization level M'1, the first metallization level of chiplet metallization stack 114. In some embodiments, device layer 112 has a thickness of 500 nm or less, and may comprise the parent semiconductor materials comprised by chiplet base 113. In some embodiments, device layer 112 comprises heterostructure transistors comprising materials that are different from the parent semiconductor material of chiplet base 113.

Chiplet metallization stack 114 is over device layer 112, and may have an architecture similar to the architecture of BEOL metallization stack 103 on host die 102. Features within metallization level M'1 are connected higher metallization levels within stack 114 (e.g., M'2, M'3, etc.) by interlevel vias (not shown). The orientation of chiplet 101 shown in FIG. 1A has the front side of chiplet 101 facing downward, with device layer 112 and chiplet metallization stack 114 adjacent to BEOL metallization stack 103.

Metallization level stack 114 comprises conductive layers 115 adjacent to dielectric layers 116. Metal level M'1 is the lowest level of metallization adjacent to device layer 112. M'4 is the upper-most level of metallization in chiplet metallization stack 114 as illustrated. Chiplet metallization stack 114 may comprise any number of metallization levels.

In some embodiments, the material compositions of the conductive layers 115 and dielectric layers 116 are substantially the same as described above for BEOL metallization levels 103. For example, thicknesses of layers 115 and 116 may range from 10-100 nm for the lower-most levels (e.g., level M'1), up to 8 microns in the highest levels. Size and pitch of features may increase from level to level, from a minimum of 10-100 nm pitch for transistor interconnects within level M'1 (not shown) to 10 micron pitch (e.g., pitch P2) for frontside pads 117 in level M'4.

In the illustrated embodiment, chiplet 101 is inverted so that chiplet metallization stack 113 on the front-side of chiplet 101 is between device layer 112 and BEOL metallization 103 on host die 102. Level M'4 of chiplet metallization stack 114 comprises features, such as frontside pads 117, having a feature pitch P2 for alignment to pads 111 in metallization level M4 of BEOL metallization stack 103.

In some embodiments, chiplet metallization stack 114 is hybrid-bonded to BEOL metallization stack 103. Consequently, host chip pads 111 and chiplet frontside pads 117 are fused together by diffusion bonds. Some offset of host chip pads 111 relative to chiplet frontside interconnect pads 117 is shown in the figure to indicate small misalignment may be present in the structure due to chiplet positioning inaccuracies, as described below. Larger feature size pitches in the upper-most level of chiplet metallization stack 114 may enable large offset tolerances for chiplet attachment.

Diffusion bonds may be characterized by metallic interdiffusion of metal atoms between adjacent pads. Similarly, adjacent dielectric layers 107 of BEOL metallization stack 103 and dielectric layer 116 of chiplet metallization stack 114 are fused, for example by formation of covalent bonds (e.g., Si—O—Si bonds) between dielectric layers 107 and 116.

In some embodiments, chiplet 101 comprises back side metallization. In the illustrated embodiment, backside metallization is between device layer 112 and M5 of BEOL stack 103. Chiplet backside metallization comprises backside interconnect pads 118 on a single dielectric layer 119. In some embodiments, backside dielectric layer 119 comprises the same or similar materials comprised by dielectric layers 116. Interlevel vias 120 extend from interconnect pads 118 though backside dielectric 119, through semiconductor base 113, and terminating in device layer 112. Chiplet backside vias 120 may interconnect one or more backside pads 118 to transistor terminals in device layer 112, for example. Backside pads 118 may couple to I/O data signal and power routing in higher metallization levels of BEOL stack 103 the interlevel vias 126. The minimum feature pitch P3 (e.g., pitch of vias 120) may correspond to power and ground rail pitches over device layer 112. Diameters of chiplet backside vias 120 may range from 50 nm to 2000 nm.

One or more through-device layer vias (TDVs) 121 extend through device layer 112, connecting backside interconnect pads 118 to chiplet metallization stack 114 at one or more levels. Within BEOL stack 103, TDVs 121 interconnect front side metallization to higher BEOL metallization levels through interlevel vias 126. Multiple TDVs 121 may have regular or irregular feature pitches. Smaller diameters of TDVs 121 are enabled by smaller thicknesses (e.g., 2000 nm or less) of chip base 113. In some embodiments, TDVs 121 have CDs (critical dimensions, e.g., diameters) ranging from 50 nm to over 1000 nm. TDVs 121 having diameters under 100 nm may have minimal impact on device layer density. TDVs 121 having diameters under 200 nm may be positioned between individual transistors, or confined to zones between backs of transistors. TDV footprint may include a keep-out zone (not shown) surrounding individual TDVs. The keep-out zone is a region adjacent to the individual vias that excludes any structures such as metallization or devices.

Signals and/or power may be routed from a package substrate or interposer (not shown) through first-level interconnects (FLIs) 130. Circuitry in device layer 104 that is below chiplet 101 may receive or send signals that are passed through chiplet device layer 112 and through chiplet metallization stack 114. TDVs 121 may therefore improve the electrical transparency of chiplet 101 by routing control signals (e.g., I/O data) and/or power from higher BEOL metallization levels to circuitry on host chip 102 through chiplet 101. Circuitry within device layer 104 directly below chiplet 101 may therefore benefit from higher power and/or signal density. Compared to routing signals and power around chiplet 101, the shorter signal paths through chiplet 101 may minimize parasitic losses.

In some embodiments, composite chip 100 comprises fill dielectric layer 122 over BEOL metallization stack 103. Fill dielectric layer 122 may fully surround chiplet sidewalls 123, embedding chiplet 101 within dielectric material. Fill dielectric 122 may stabilize and strengthen the composite die structure 100, and/or provide a platform for higher BEOL metallization layers (e.g., see FIGS. 2A-B). In some embodiments, fill dielectric layer 122 comprises an inorganic dielectric material, such as, but not limited to, amorphous and polycrystalline silicon oxides, in some cases having a higher k than ILD materials. In some other embodiments, fill dielectric layer 122 comprises an organic material, such as, but not limited to, epoxy resins and epoxy resin composites. Vias 124 extend through fill dielectric layer 122. Vias 124 may interconnect upper BEOL metallization levels or embedded devices to level M4 and lower metallization levels. Vias 124 may route power and/or signals to device layer 104.

Figure 1B:
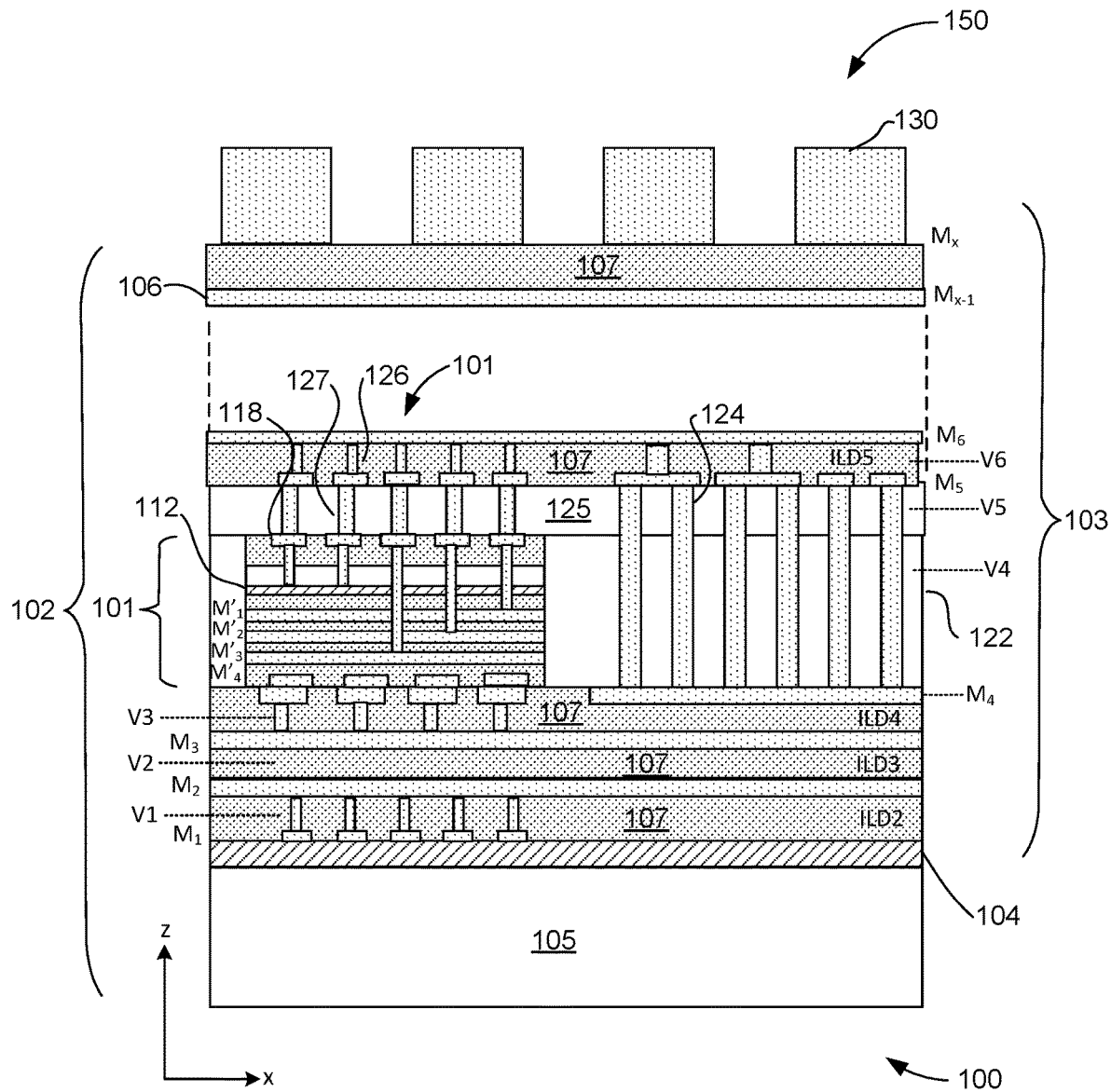
FIG. 1B illustrates a cross-sectional view in the x-z plane of a composite chip structure, according to some embodiments of the disclosure.

FIG. 1B illustrates a cross-sectional view in the x-z plane of composite die structure 150, according to some embodiments of the disclosure.

Composite die structure 150 comprises dielectric overlayer 125 over chiplet 101 and fill dielectric 122. Dielectric overlayer 125 may has a thickness ranging between several tens of nanometers to 5 microns, and may comprise dielectric materials employed in fill dielectric 122. In some embodiments, dielectric overlayer 125 comprises dielectric materials such as, but not limited to, polycrystalline silicon oxides, silicon nitrides, silicon oxynitrides, silicon carbide and silicon carbide nitrides. In some embodiments, second dielectric layer comprises amorphous silica-based materials (e.g., spin-on glasses). In some other embodiments, dielectric overlayer 125 comprises organic materials, such as, but not limited to, epoxy resins and epoxy resin composites. Dielectric overlayer 125 may have a thickness in the same range as ILDs 107

Through-vias 124 may extend through dielectric overlayer 125, terminating at BEOL M5. A via level V5 extends through dielectric overlayer 125. In some embodiments, vias 127 comprise metals such as, but not limited to, copper, nickel, cobalt, tungsten, titanium, titanium nitride, tantalum, tantalum nitride, and platinum. Chiplet backside pads 118 may be interconnected to higher BEOL metallization levels by vias 127. Diffusion barrier materials in vias 127 may protect chiplet 101 from contamination by metal interdiffusion into backside pads 118.

Figure 2A:
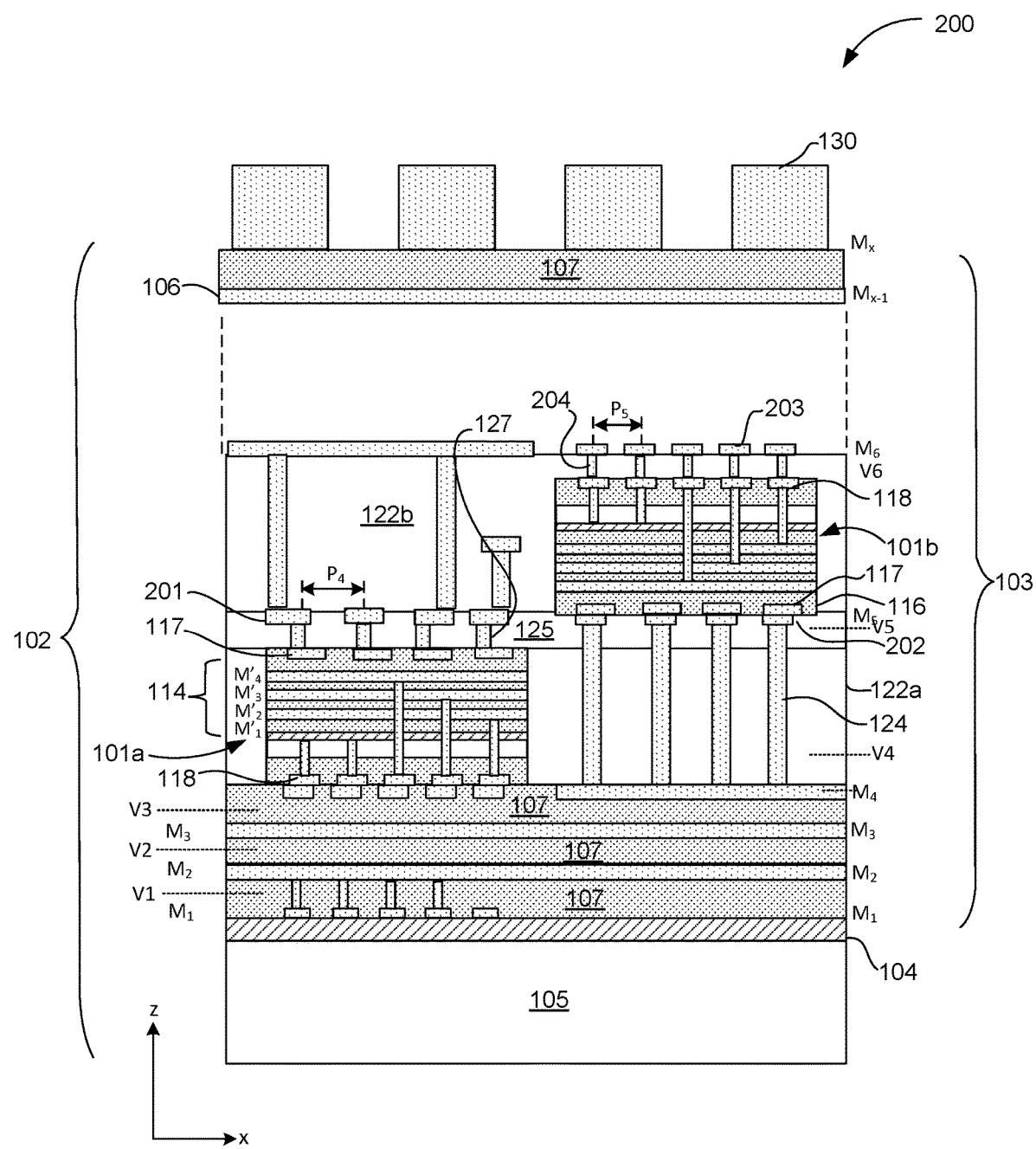
FIG. 2A illustrates a cross-sectional view in the x-z plane of a composite chip structure, according to some embodiments of the disclosure.

FIG. 2A illustrates a cross-sectional view in the x-z plane of composite die structure 200, according to some embodiments of the disclosure.

Composite die structure 200 comprises lower chiplet 101a embedded in fill dielectric 122. Lower chiplet 101a is oriented such that backside interconnects comprising backside pads 118 are below device layer 112 in the figure, and interfaced with BEOL metallization stack 103 (e.g., reverse of the orientation shown in FIGS. 1A-1B). Chiplet metallization stack 114 on the frontside of chiplet 101 is oriented upwards in the figure to interface with BEOL metallization features 201, which may be a multiple traces or multiple pads in BEOL metallization level M5. Dielectric overlayer 125 covers lower fill dielectric 122a and chiplet 101, intervening between front side interconnect pads 117 in top chiplet metallization level M'4 and BEOL stack metallization features 201 in M5. Vias 127 extend through dielectric layer 125, connecting chiplet frontside pads 117 to metal features 201 in M5 and to higher metallization levels in BEOL stack 103.

In the illustrated embodiment, composite die structure 200 comprises upper chiplet 101b attached to pads 202 at level M5. In the illustrated embodiment, chiplet 101b is shown to be substantially identical to lower chiplet 101a. However, upper chiplet 101b may have any other architecture. In some embodiments, upper chiplet 101b is staggered with respect to lower chiplet 101a. In the illustrated embodiment, upper chiplet 101b is inverted with respect to lower chiplet 101a, however, the relative orientations of chiplets 101a and 101b may vary. In some embodiments, frontside interconnect pads 117 are diffusion bonded to pads 202 in M5.

In some embodiments, upper chiplet 101b is embedded in upper fill dielectric layer 122b. Upper fill dielectric 122b may have a thickness that is at least equal to the z-height of upper chiplet 101b. Upper fill dielectric 122b enables higher levels within BEOL stack 103, starting at level M6 above upper chiplet 101b. In the illustrated embodiment, level M6 comprises interconnect pads 203 to which chiplet backside pads 118 are coupled by vias 204. Vias 124 similarly extend through lower dielectric layer 122a to pads 202 in BEOL metallization layer M5, interconnecting upper chiplet 101b to BEOL metallization level M4. Above upper chiplet 101b, BEOL metallization stack 103 comprises more levels of metallization above level M6 terminating at top metallization level Mx, comprising FLIs 130.

Figure 2B:
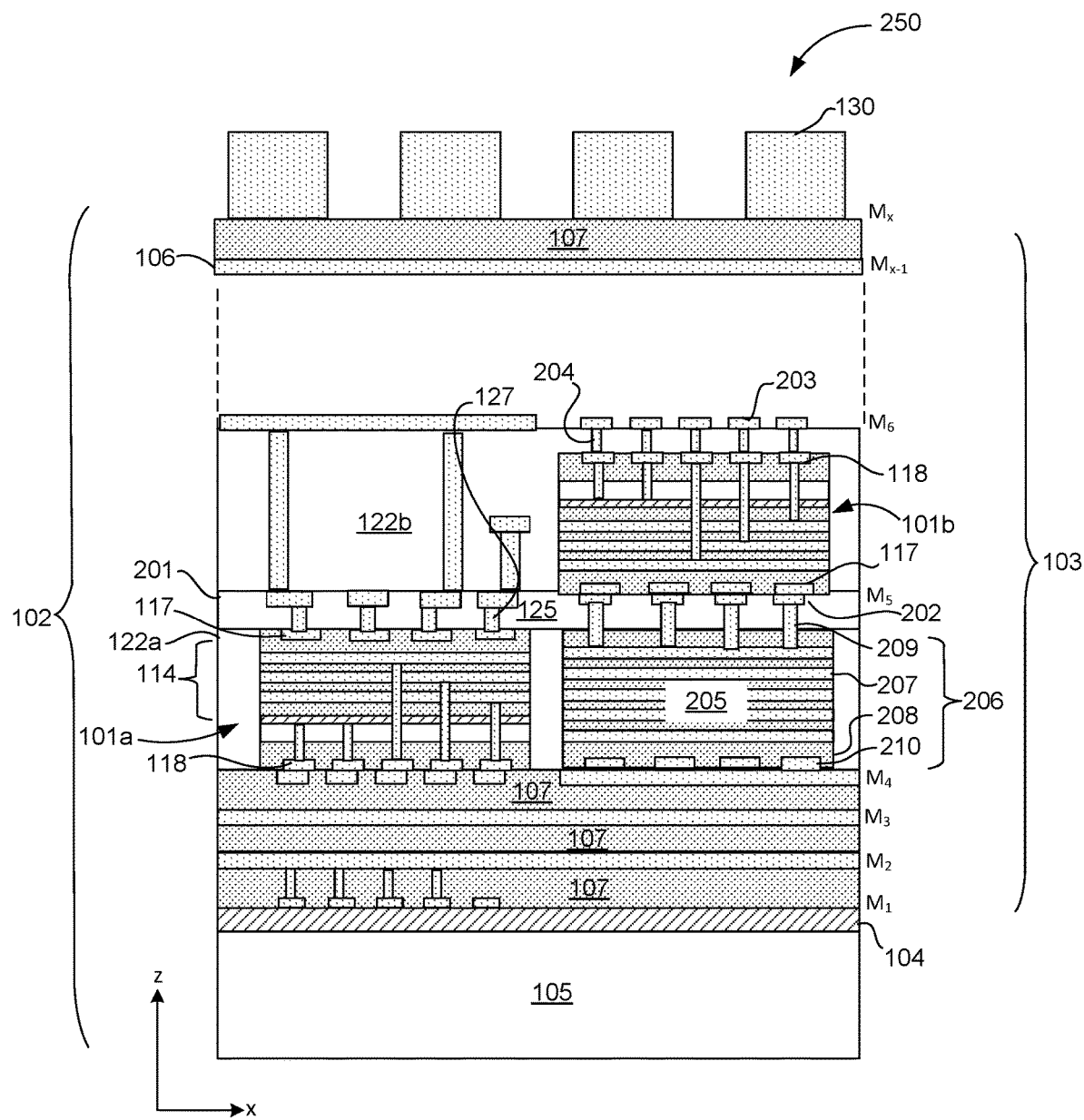
FIG. 2B illustrates a cross-sectional view in the x-z plane of a composite chip, according to some embodiments of the disclosure.

FIG. 2B illustrates a cross-sectional view in the x-z plane of composite chip 250, according to some embodiments of the disclosure.

Composite chip structure 250 has substantially the same architecture of composite die structure 200 (FIG. 2A), but vias 124 are replaced by a passive interconnect chiplet 205. In the illustrated embodiment, passive interconnect chiplet 205 is embedded in lower fill dielectric layer 122a adjacent to chiplet 101a. Passive interconnect chiplet 205 is a passive structure, such as an interposer, and may lack an active device layer as included in chiplet dies 101a and 101b. Passive interconnect chiplet 205 comprises metallization stack 206 including metal layers 207 interleaved with dielectric layers 208. Layers 207 and 208 may comprise the same materials described above for chiplet metallization stack 114, for example. Passive interconnect chiplet 205 may accommodate finer feature pitches than possible with vias 124 (FIG. 2A). In the illustrated embodiment, passive interconnect chiplet 205 interconnects upper chiplet 101b to M4 within in BEOL stack 103. Vias 209 couple metallization stack 206 to pads 202 in BEOL level M5. In some embodiments, metallization stack 206 comprises pads 210 that may be directly bonded to BEOL level M4.

Figure 3A:
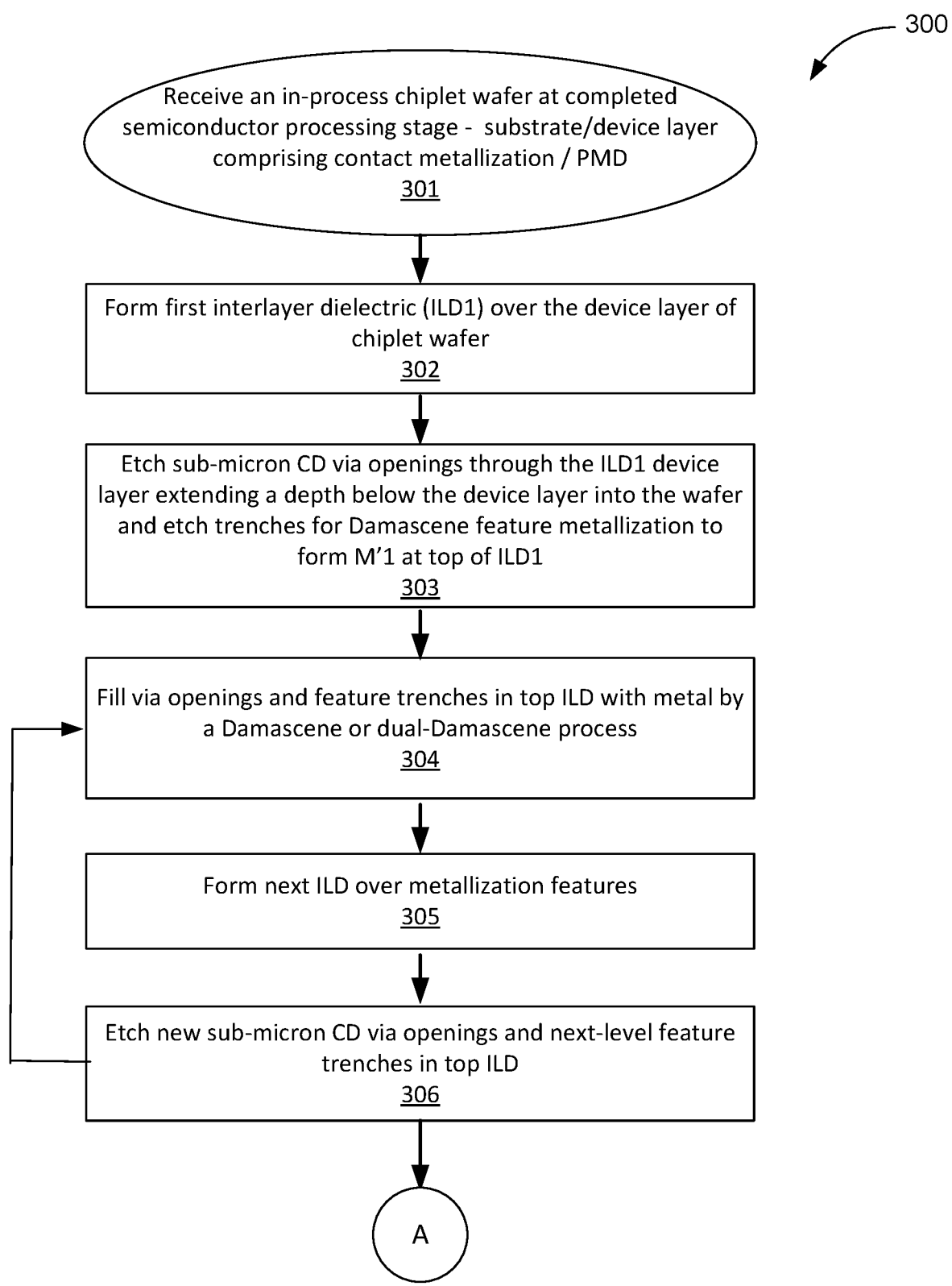
FIGS. 3A and 3B illustrate an exemplary process flow chart summarizing a method for fabrication of a chiplet, according to some embodiments of the disclosure.
Figure 3B:
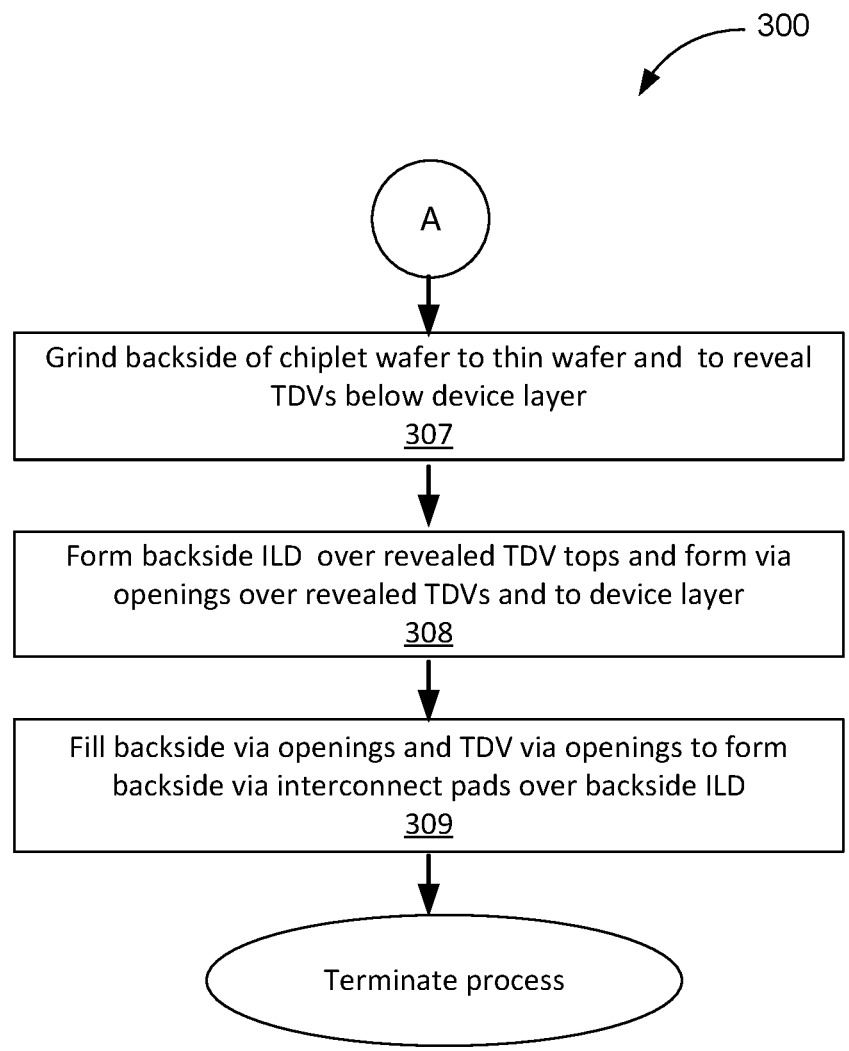

FIGS. 3A and 3B illustrate an exemplary process flow chart 300, summarizing a method for fabrication of chiplet 101, shown in detail in FIGS. 4A-4G, according to some embodiments of the disclosure.

Figure 4A:
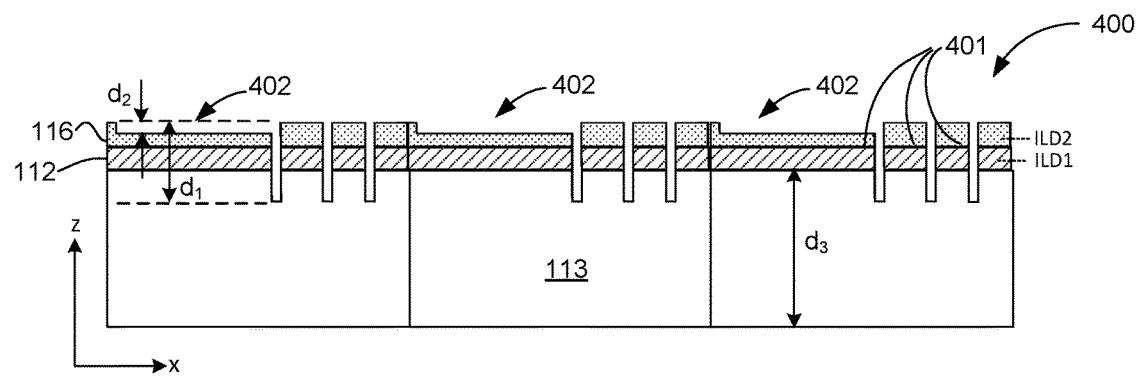
FIGS. 4A, 4B, 4C, 4D, 4E, 4F, and 4G illustrate the evolution of the process for formation of the chiplet as summarized in flowchart shown in FIGS. 3A-3B, in a series of cross-sectional views in the x-z plane, according to some embodiments of the disclosure.

At operation 301 of process flow 300 in FIG. 3A, an in-process chiplet wafer is received for metallization after completion of the fabrication of a device layer. An example of a partially fabricated chiplet wafer is shown in FIG. 4A. Chiplet wafer 400 is shown in a cross-sectional view, illustrating a completed device layer 112 over substrate 113 comprising a suitable semiconductor material, such as, but not limited to, silicon, silicon germanium, germanium, gallium arsenide, gallium indium arsenide or gallium nitride. In some embodiments, substrate 113 is a SOI wafer, having a BOX layer below device layer 112. The device layer (e.g., device layer 112) is formed on the wafer front side (e.g., during front end of line processing), and may comprise high-density integrated MOSFET transistors arranged in various n-MOS, p-MOS, CMOS or other classes of digital logic circuitry, as well as analog circuitry. In some embodiments, the device layer may comprise passive device such as resistors, capacitors, diodes and inductors. Local metallization within device layer 112 may be laid down to form transistor terminals and interconnect vias. Transistor terminals may have feature pitches that may range between 10-500 nm, and may be as small as 1-10 nm, for example. In some embodiments, a buried metallization layer is formed below gate, source and drain regions for backside contact.

Advancing to operation 302 in FIG. 3A, a process for forming a chiplet metallization stack (e.g., chiplet metallization stack 114) over the front side of the device layer may be initiated at this stage. A first interlayer dielectric is formed over the device layer, depicted in FIG. 4A as ILD layer 116. In the illustrated example, ILD layer 116 is labeled ILD1, covering device layer 112 comprising first-level metal features such as gate terminals, traces and contact pads (not shown). Alternatively, wafer 400 (FIG. 4A) may be received already having ILD layer 116 formed in an earlier operation. In some embodiments, ILD1 (and subsequent ILD layers) comprises inorganic crystalline dielectric materials such as, but not limited to, silicon oxides, silicon nitrides, silicon oxynitrides, silicon carbides, silicon carbide nitrides, silicon oxycarbides, aluminum oxides and aluminum nitrides. In some embodiments, ILD1 (and subsequent ILD layers) comprises amorphous silicate materials such as, but not limited to, undoped silicate glass (USG) and fluorosilicate glass (FSG), deposited by CVD techniques or as a spin-on glass (SOG). In some embodiments, ILD2 (and subsequent ILD layers) comprises organic dielectrics such as, but not limited to, epoxy resins, polyimides, polynorborenes, benzocyclobutene, poly tetrafluoroethylene (PTFE), hydrogen silsesquioxane and methyl silsesquioxane. ILD layer 116 may be deposited to a thickness of 1000 nm or less (e.g., 200-500 nm) to support formation of high-density interconnects to transistors in device layer 112.

Advancing to operation 303 in FIG. 3A, a plurality of via openings (holes) and trenches are formed in ILD1 layer and through the device layer, extending a distance into the semiconductor substrate on the backside of the device layer. Referring again to FIG. 4A, via openings 401 are depicted as high-aspect ratio apertures, generally submicron CDs, extending through device layer 112 a distance of up to several hundred nanometers into the unprocessed semiconductor material in substrate 113 on the backside (e.g., below) the device layer. Via openings may have a pitch P4 that may substantially correspond to transistor gate pitches (e.g., 40-1000 nm). For such small CDs and pitches, electron beam writing lithography or extreme ultraviolet lithography for example, may be employed to define an etch mask, which may be metal or silicon nitride mask. In some embodiments, via openings 401 extend to a buried oxide (BOX) layer, which may be employed as an etch stop. Via openings 401 may be formed by a high aspect ratio anisotropic etch process, such as a deep reactive ionic etch (DRIE, e.g., a nanometer-scale Bosch process) through a lithographically-defined etch mask having a hole pattern corresponding to via positions. The etch process may produce substantially straight sidewalls in via openings 40, or may be optimized to produce tapered sidewalls if desired, having a cd (e.g., diameters) ranging from 50 nm to 1000 nm and a depth d1 of up to several hundred nanometers. As an example, via holes may be formed by a modified Bosch process through oxides and silicon having an average diameter of 100 nm and an aspect ratio of at least 20-25, having a depth of up to approximately 2000 nm.

The particular numbers and distribution of TDV via openings 401 may be determined by locations and extents of device-free regions, generally comprising an isolation dielectric. As TDVs penetrate through device layer 112, they need to be clear of device keep-out zones, and therefore not be in any particular registration with the transistors or other devices. However, to minimize the impact on transistor density in a high-density device layer 112, the TDV CD may be at a submicron scale to permit a large number of TDVs to traverse device layer 112 without significant disruption of transistor packing that may require reduction in their number in a given area. Integrated circuitry layouts within device layer 112 may be organized to provide extensive device-free regions for formation of TDVs. In some embodiments, via openings 401 may be made between individual transistors, or in field regions between arrays or blocks of transistors. Field regions generally comprise an isolation dielectric surrounding active semiconductor regions to isolate circuits or individual devices. In lower density device layers, larger TDVs (e.g., CDs of several microns) may be formed in larger field regions with minimal or no impact on device layer density.

In the example illustrated in FIG. 4A, shallow trenches 402 for in-plane metallization features such as pads and traces that constitute metallization level M'1 may be formed by a second dielectric etch of ILD1 (116), after deep etching of via openings 401. A second lithographically-defined dry etch mask (e.g., a hard photoresist) may be aligned to via openings 401, and trenches etched by a dry etch (e.g., Bosch) process may be employed to form trenches 402 to a depth d2 of 10-50 nm. The thickness of trenches 402 may be substantially less than the thickness of ILD1.

Advancing to operation 304 of process flow 300 in FIG. 3A, metal is deposited into etched via openings and trenches by two successive iterations of a single Damascene process or a dual Damascene process. In a first single Damascene iteration, either vias or trenches are formed, then filled by a first metal deposition and planarized to remove the overburden (e.g., overfill) and cause the metallization to be planar with the dielectric surface. The first Damascene process is followed by a second Damascene process, where trenches are formed if vias were formed first, or vice-versa. The second etched features are filled by second metal deposition, then planarized a second time to remove any overburden and level the formed metal features with the dielectric surface. Thus, the metal features are sunken below the level the ILD, enabling a low z-height of the multi-level stack.

In a dual Damascene process, via holes and trace and/or pad trenches are formed before metallization. A single metal deposition is employed, filling both via holes and trenches simultaneously. Metal deposition is followed by a planarization operation to remove overburden, forming through-device layer vias and in-plane metallization features in ILD1.

Metal deposition may be performed by electroplating of metals such as copper, gold or nickel into the etched features. Preceding electroplating, first a barrier layer followed by an electroplating seed layer are deposited as thin films into the etched features. A barrier layer may comprise a conformal titanium or titanium nitride film in direct contact with the dielectric, to prevent diffusion and contamination by atoms of metallization metal. The barrier layer may be 1 to 5 nm thick. The seed layer may comprise the same metal as that being plated, such as copper. Barrier and seed layers may be deposited by any suitable physical deposition technique, such as RF and/or DC sputtering, or by vacuum evaporation of metals. While electroplating is a suitable deposition process for noble metals such as copper and gold, as well as nickel, via openings 401 and in-plane trenches 402 may alternatively be filled by a chemical vapor deposition process of aluminum and refractory metals such as tungsten, tantalum and titanium. In some embodiments, metal structures may be formed by electroless deposition.

Figure 4B:
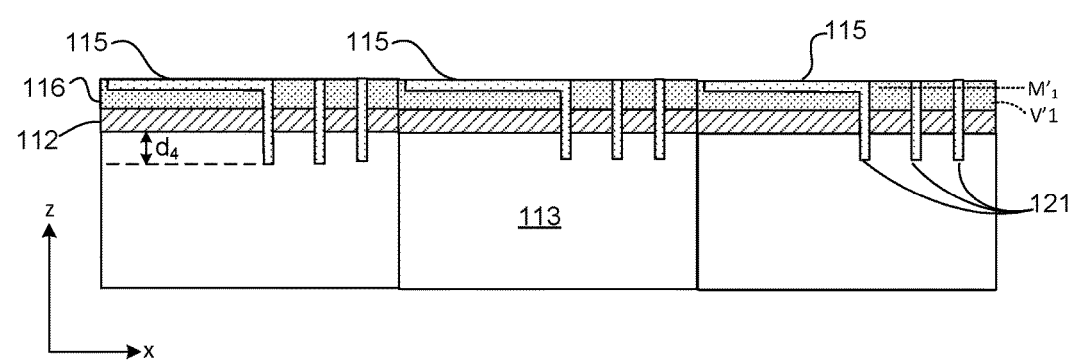

In FIG. 4B, first level metallization features resulting from the above-described operations are shown as TDVs 121 extending orthogonally from sunken in-plane features 115 in M'1, through device layer 112 and a distance d3 into substrate 113 on the backside of device layer 112. TDVs 121 formed by filling via openings 401 are initial growth segments of TDVs 121 extending from device layer backside to device layer front side. ILD1 is coincident with first via level V'1, the segment of TDVs extending between device layer 112 and M'1 on device layer front side. In the illustrated example, some TDVs 121 are landed, extending only through via level V'1 and terminating on metallization feature 115 in level M'1. Other TDVs 121 are unlanded, having no anchoring metallization feature in M'1. As will be shown, these TDVs will be extended further into the growing metallization stack in subsequent operations to land on features at higher metallization levels.

Advancing to operation 305 in FIG. 3A, the next (e.g., second) ILD layer is formed over metallization level M' 1. The second ILD layer may be substantially identical to the first ILD. In some embodiments, the thickness of the second ILD layer (ILD2) may be greater than the first ILD thickness, as metallization feature sizes and pitch may incrementally increase at each higher metallization level. Thus, metallization feature size and pitch in level M'2, to be formed over ILD2 may be greater than corresponding values in level M' 1.

At operation 306 in FIG. 3A, a plurality via openings are formed in the second ILD layer in via layer V'2 in ILD2 by a dry etch process. The dry etch process may be substantially the same as that used to form V'1 (e.g., a nanometer-scale Bosch process with the same etch parameters). The V'2 via openings are aligned over the unlanded TDVs formed in V'1 and M'1 in the previous metallization operations described above. The V'2 via openings may have substantially the same diameters of the first V'1 TDVs. In a second etch, and be formed by the same process employed for formation of the first segments.

Similarly, in-plane metallization feature trenches similar to trenches 402 in ILD1, are formed in a separate etch process. For example via openings similar to via openings 401 may be formed in a first etch, and in-plane trenches may be formed in a subsequent second etch. The reverse order of etching the features may be an equally valid process choice. After formation of via holes and trenches, formation of V'2 TDVs and M'2 metallization features may proceed by substantially the same operations as described above. As the metallization stack is built up, substantially the same operations may be employed for formation of each ILD and metallization level.

Figure 4C:
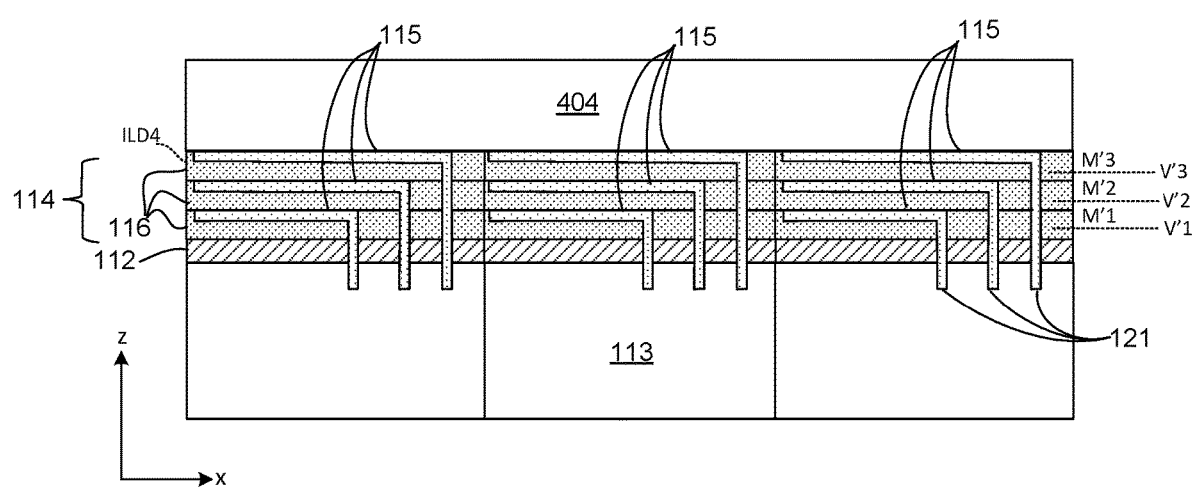

The recirculating arrow in FIG. 3A indicates a repetition of operations 305-306 that may be employed for creation of successive metallization levels during build-up of the metallization stack. An example of a completed stack is shown in FIG. 4C, showing three metallization levels 115 (M'1 to M'3) separated by an ILD layer 116. In the illustrated embodiment, each metallization layer comprises the same materials and is fabricated in substantially identical manner according to the repetitive operations 304-306 in process flow 300 in FIG. 3A. In alternative embodiments, a different etch and deposition methods may be employed at different levels within the stack. In general, the layer thickness may incrementally increase as the number of stack levels increase. The number of levels in the chiplet metallization stack may depend on minimum feature pitch required to substantially match the minimum features pitch in the chiplet interface layer of the BEOL metallization stack of the host chip (e.g., pitch P2 in FIG. 1A). For relatively large interconnect sizes and pitches that may be present at a specific BEOL layer in the host chip metallization stack (e.g., BEOL metallization stack 103) at which the chiplet is attached, more metallization levels may be required to expand the fine feature CD's and pitch proximal to the device layer of the chiplet (e.g., device layer 112), for example to expand from pitch P3 of device layer 112 to P2 at the chiplet-host wafer interface (see FIG. 1A).

In the example structure shown in FIG. 4C, TDVs 121 are landed at metallization features 115 in different metallization levels M'1-M'3 in chiplet metallization stack 114. In alternative embodiments, multiple TDVs 121 may land on features such as traces and pads in the same metallization level. The TDVs 121 shown are each landed at different metallization levels to show that front side metal features 115 in each level may be have access to backside metallization through the through-device layer interconnections provided by TDVs 121.

In preparation for a further processing operations, a carrier substrate 404 may be attached to the topmost level of chiplet metallization stack 114 Carrier 404 may provide mechanical support as further processing may render chiplet wafer 400 more fragile.

Advancing to operation 307 in FIG. 3B, the backside of the chiplet wafer is thinned to reveal the bottoms of the TDVs on the backside of the device layer. The TDV bottoms may be the tops of the TDVs on the backside of the chiplets, and may be further extended by backside metallization. The chiplet wafer may be attached to a carrier wafer for mechanical support of the thinned wafer, which may have an overall thickness of 10 microns or less.

Figure 4D:
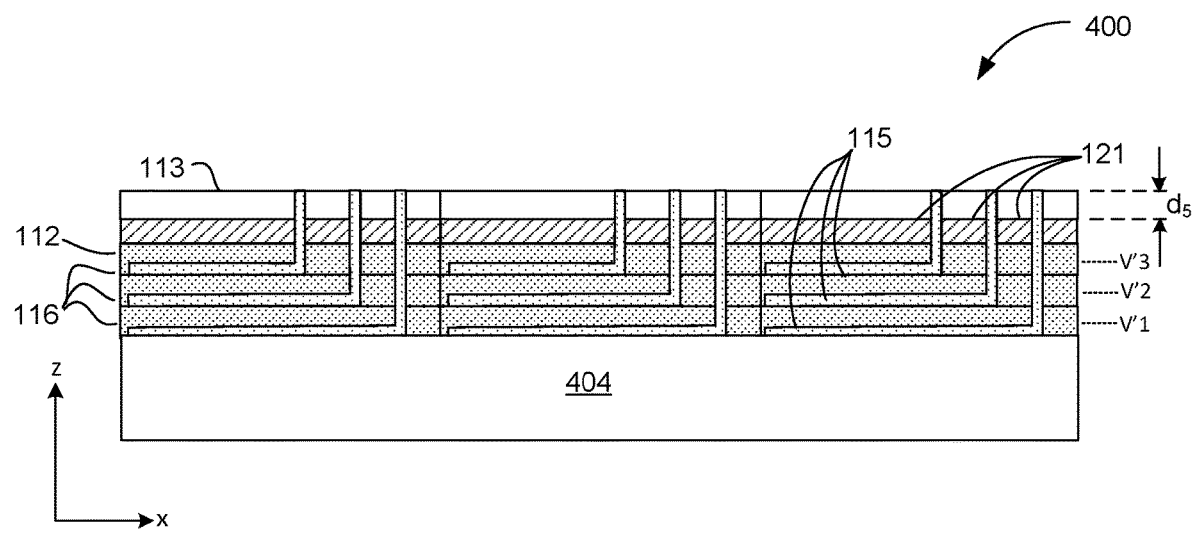

FIG. 4D shows a cross-sectional view of chiplet wafer 400 (now inverted) after thinning bulk material 113 from the backside to a thickness d5 of a few microns (e.g., 1-2 microns) down to submicron thicknesses, for example, from an original thickness of 200-700 microns. Substrate 113 may not be shown to scale relative to device layer 112 (thickness ranging between 100 to 1000 nm) and ILDs 116. Thinning of substrate 113 to small thicknesses under a few microns (e.g., 1 or 2 microns, excluding device layer thickness) may be necessary to support submicron CD TDVs 121, as dry etch (e.g., nanometer-scale Bosch processes) aspect ratios for submicron CD trenches and holes are currently limited to at least 10 to 15. A maximal substrate thickness of 1000 to 1500 nm (e.g., 1.0 to 1.5 micron) may support backside vias and TDVs having a 100 nm diameter. Depending on the thickness of device layer 112 and CD of TDVs 121, substrate 113 may be thinned to virtually zero thickness, completely removing any inactive material of substrate 113, leaving only device layer 112 to support TDVs 121. Device layer 112 may have thicknesses ranging between 100-1000 nm.

Thinning operations include, but are not limited to, chemical-mechanical planarization (CMP) on the wafer backside, removing bulk semiconductor material by abrasive grinding and chemical dissolution and polishing. The wafer thickness may be reduced to reveal bottoms of TDVs 121 below device layer 112 (e.g., on the backside), and may be substantially equal to depth d4 (e.g., 1-2 microns) of TDVs 121 below device layer 112.

Advancing to operation 308 in FIG. 3B, an ILD is formed over the backside of the device layer and via holes are patterned within the backside ILD. The backside ILD may be formed by substantially the same materials and methods employed for the formation of the ILD layers in the front side metallization stack. The backside ILD layer may cover the thin (e.g., 1-2 micron) substrate layer 113 over device layer 112, or directly exposed device layer 112 if substrate 113 is completely removed, as well as revealed bottoms of the TDVs. In the latter case, a backside ILD may passivate and protect exposed devices and device-layer metallization, as well as insulate the device layer from backside metallization features such as backside vias and pads for interconnection of chiplet backside to the BEOL metallization stack (e.g., BEOL stack 103).

Figure 4E:
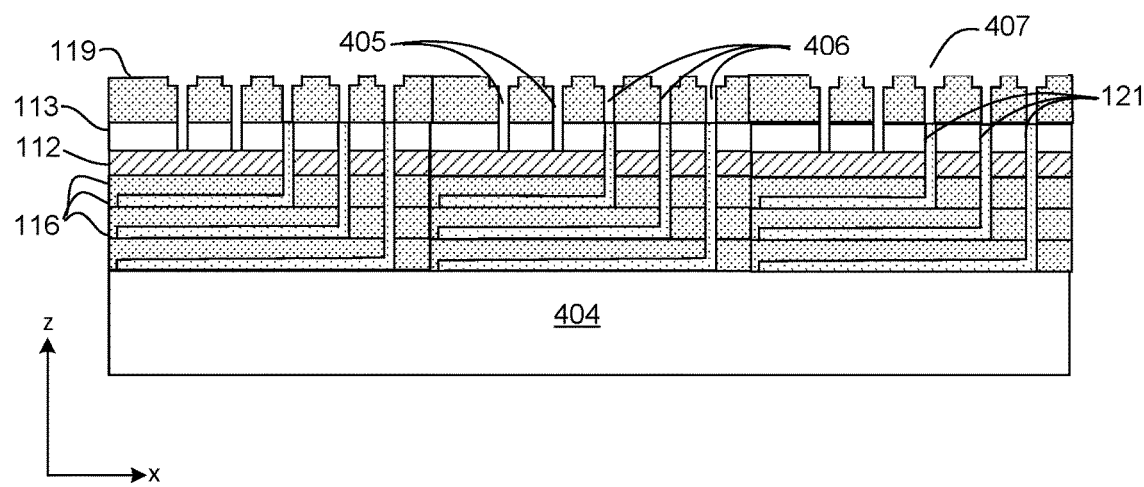

An example structure is shown in FIG. 4E. Backside ILD 119 is shown to be formed over thinned substrate 113, but may alternatively be in direct contact with device layer 112, as noted above. ILD 119 may comprise substantially the same materials as front-side ILDs 116 and may be formed by the same process (e.g., RF sputtering, atomic layer deposition, CVD), and may have a thickness of under 500 nm. Backside via holes 405 have been formed through ILD 119 and substrate 113 (if present), extending to the backside of device layer 112. Backside via holes 405 may be aligned over buried transistor terminal metallization, formed on the backside of device layer 112, for example, underneath the source and drain regions below n-wells and p-wells in a CMOS architecture during fabrication of device layer 112 in previous operations. Buried transistor terminals formed below source/drain regions or gates may act as etch stops for via holes 405.

TDV via holes 406 extend through ILD 119 to terminate on bottoms of TDVs 121, which may serve as etch stops. In some embodiments, a second etch operation is performed over ILD 119 to fabricate trenches 407 for via pads. Via pad trenches 407 need not be formed at this stage if, for example, via pad trenches 407 are to be formed for a second Damascene process after deposition of vias is complete.

Figure 4F:
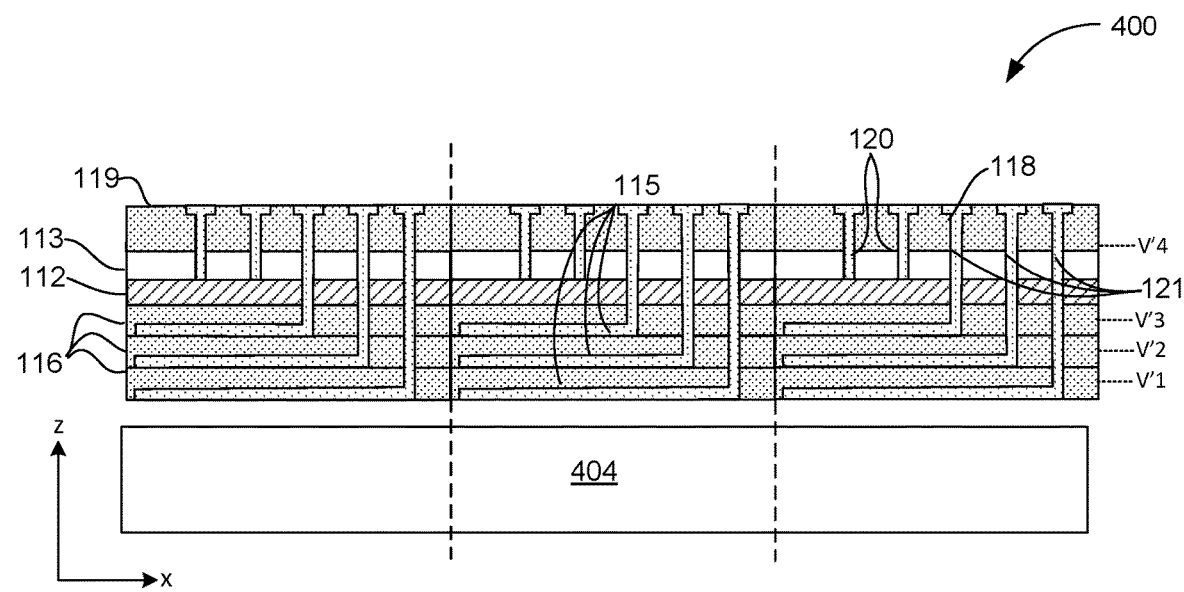
Figure 4G:
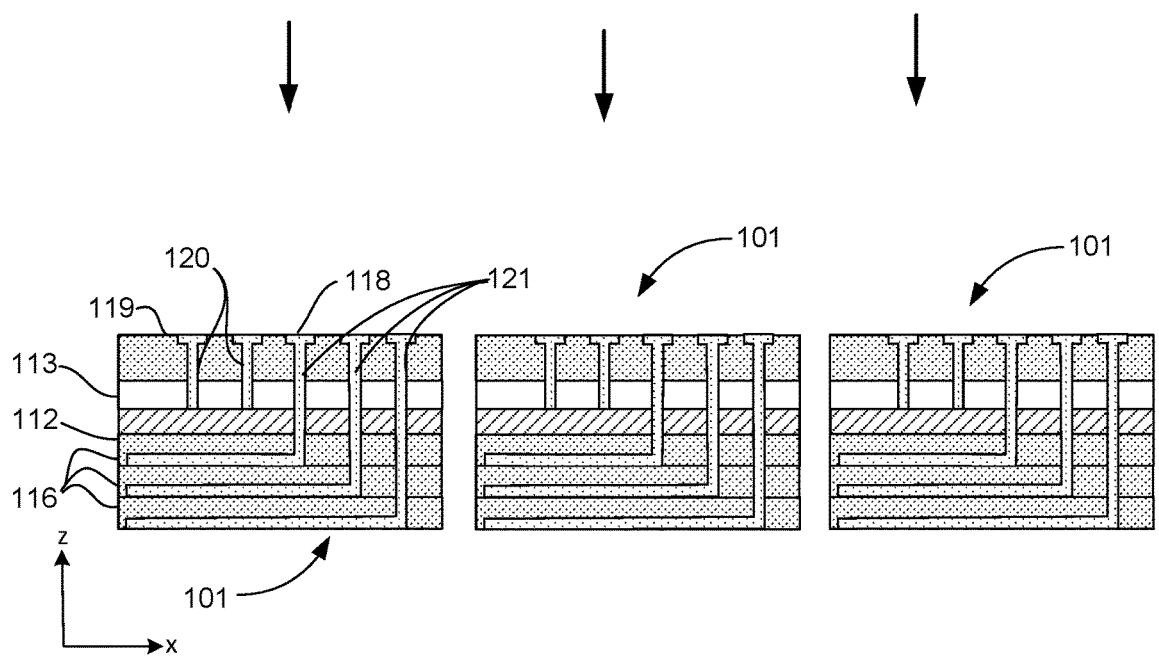

Advancing to operation 309 in FIG. 3B, backside vias openings and pad trenches are filled in a metal deposition, creating backside vias and interconnect pads. An illustrated example of the resulting structure is shown in FIG. 4F. Backside vias 120 and TDVs 121 extend through backside ILD 119, forming via level V4. Backside contact pads 118 may be grown over the tops of backside vias 120 and TDVs 121 in a dual Damascene process or a second single Damascene process. The backside contact pads 118 are to interface to contact pads in a host chip BEOL metallization level (e.g. level M5 in FIG. 1A) formed after chiplet attach, as shown in FIG. 1A, or to interface at the BEOL metal level of chiplet attach (e.g., M4 in FIG. 2A).

Figure 5:
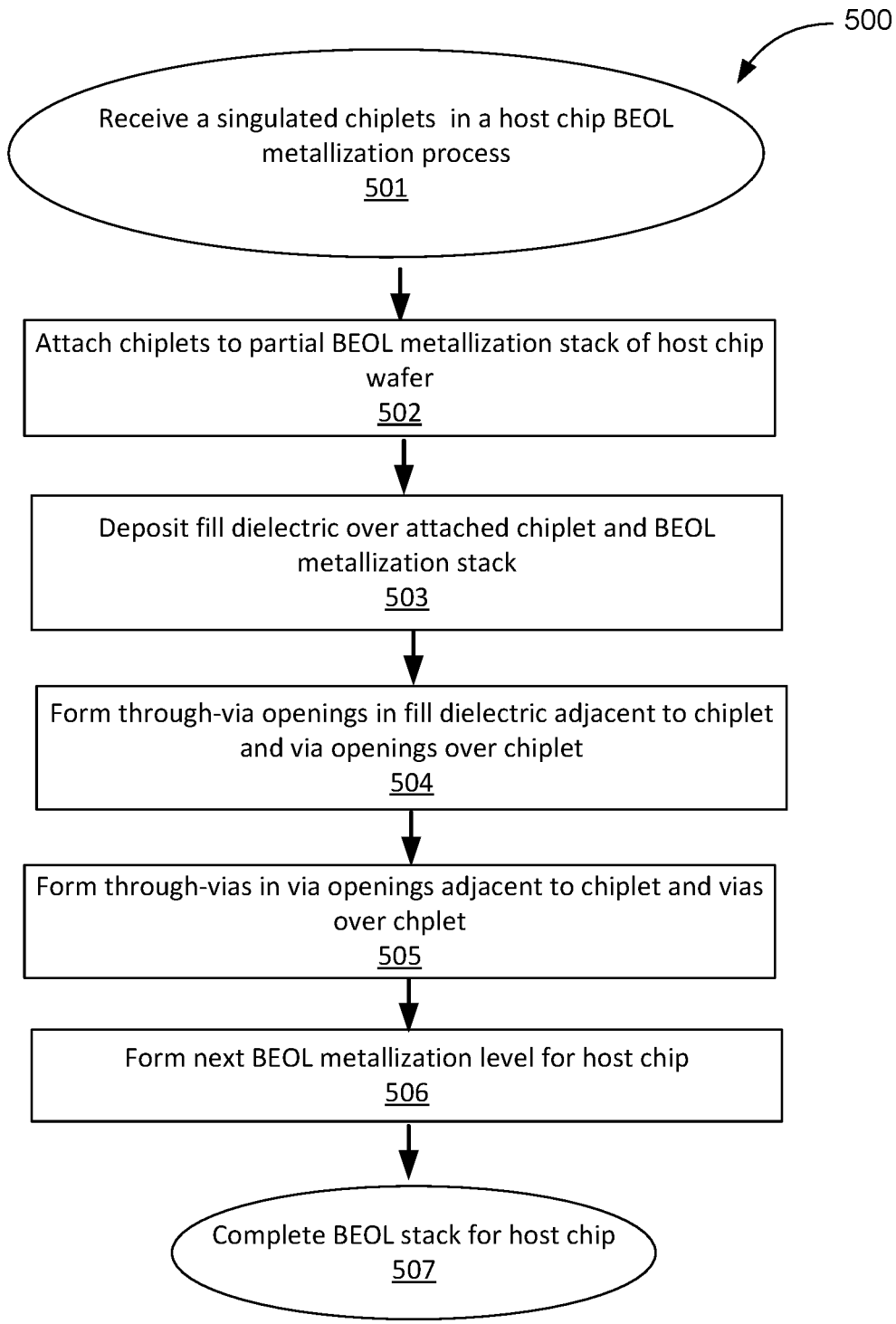
FIG. 5 illustrates a process flow chart summarizing a chiplet attach process, according to some embodiments of the disclosure

FIG. 5 illustrates a process flow chart 500 summarizing a chiplet die attach process shown in detail in FIGS. 6A-6F for fabrication of composite die structure 100, according to some embodiments of the disclosure.

At operation 501, singulated chiplets are received into a back-end of the line (BEOL) metallization process of a host chip wafer (e.g., host die wafer 102 in FIG. 1A). The singulated chips may be formed as described for FIG. 4G (e.g., chiplets 101). In some embodiments, singulated chiplet dies may be attached on a handle wafer (e.g., carrier wafer 404) for mechanical support.

At operation 502, individual chiplet dies are attached and bonded to the host die wafer after partial completion of a BEOL metallization layer (e.g., BEOL metallization stack 103 on host die wafer 102, FIG. 1A). A suitable attachment process may comprise a pick-and-place operation. Individual chiplets may be placed, or multiple chiplet dies up to several hundred at one time may be simultaneously placed over a partially complete BEOL metallization stack on the host wafer. Metallization may be completed include several metal levels, for example up to M4 as shown in FIG. 1A.

The wafer-level chiplet attach process may comprise a hybrid bonding process to the top-most metallization level of the host die that is completed before chiplet attachment, where metal contacts on the highest host die metallization level completed, and top-level interconnects on the chiplet metallization stack are joined by metal diffusion bonding, and top-level dielectric layers from the chiplet stack and the host die stack are atomically bonded together. Adhesion strength may be increased by addition of interfacial layers. Multiple chiplet dies may be attached to a single host die at wafer level, and at more than one level in the BEOL stack on the host die.

At operation 503, a fill dielectric (e.g., fill dielectric 122) is deposited at wafer level over the bonded chiplet and the open portions of the partial metallization stack (e.g., BEOL stack 103 in FIG. 1A) of the host die wafer. The fill dielectric may be spin-on glass or an organic polymeric resin, such as an epoxy resin. The fill dielectric may stabilize the bonded chiplet on the host wafer by potting the chiplet, increasing adhesion to the host die. Subsequently, the fill dielectric may be planarized to the top surface of the bonded chiplet, exposing backside contacts on the chiplet. The planarized fill dielectric may provide a substrate for continuation of metallization stack build-up and the next BEOL metallization level above the chiplet.

At operation 504, through-via openings (e.g., through-vias 124, FIG. 1A) are formed in the fill dielectric adjacent to a sidewall of the bonded chiplet. The through-via openings may be formed as high-aspect ratio apertures extending several microns from top to bottom of the fill dielectric. The via openings may have larger diameters relative to vias in the interlayer dielectric levels in the BEOL metallization stack. The intended through-vias adjacent to the chiplet may shunt vertical power and/or I/O data signal routing adjacent to the chiplet.

At operation 505 the through vias are formed by filling through-via openings during a BEOL metallization process. The formation of through-vias may be accompanied by formation of the next metallization level (e.g., level M5 in FIG. 2A) in the BEOL stack (e.g., BEOL stack 103).

At operation 506, the next BEOL stack metallization level may be formed by overgrowth of through vias in operation 505, or by simultaneous growth of a metal layer over the fill dielectric top surface. Features may be formed by metal etching through a lithographic mask or by metal CVD.

At operation 507, build-up of the BEOL stack over the host chip wafer is continued by repetition of operation 505 to create additional metallization levels and addition of a ILD layer between metallization levels.

FIGS. 6A-6F illustrate a method of manufacture of composite die structure 100, according to some embodiments of the disclosure.

Figure 6A:
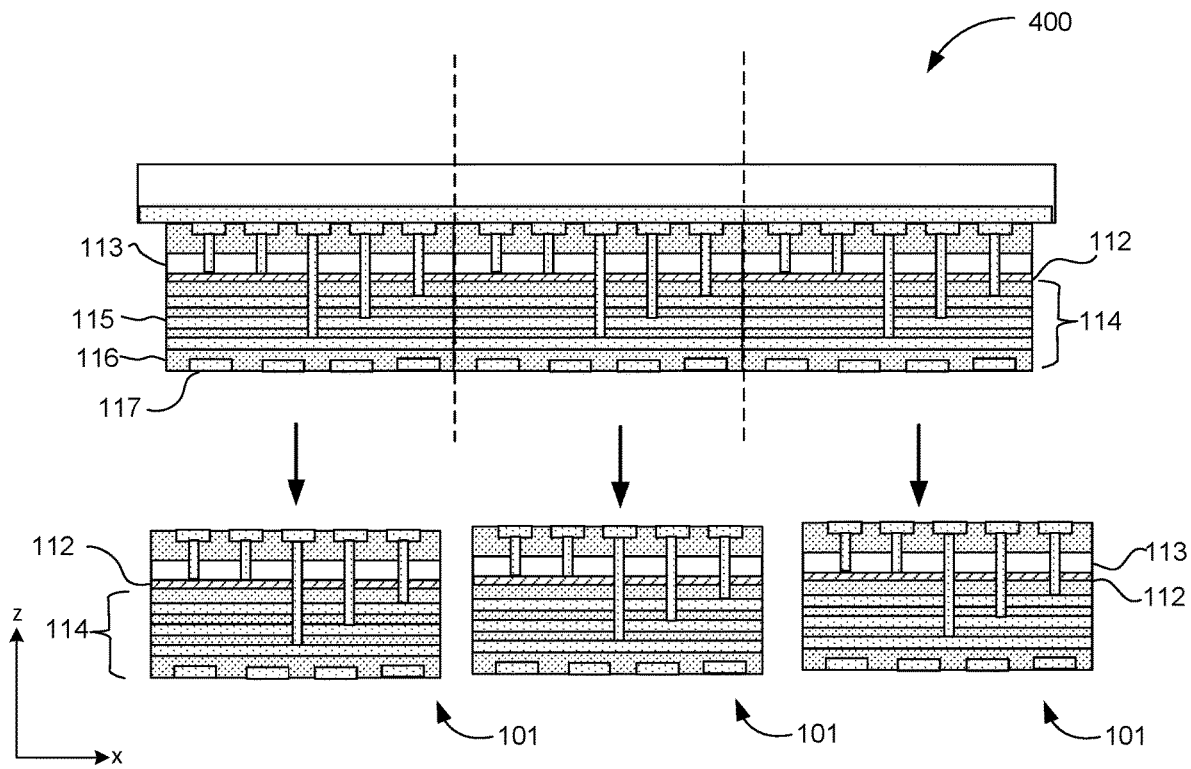
FIGS. 6A, 6B, 6C, 6D, 6E, and 6F illustrate a method of manufacture of a composite chip structure summarized by the process flow chart in FIG. 5, according to some embodiments of the disclosure.

At the operation illustrated in FIG. 6A, chiplet wafer 400 comprises device layer 112 that has been formed on semiconductor base 113 in previous operation. Device layer 112 may include arrays of MOSFET transistors (e.g., fabricated in 50 nm to 100 nm CMOS processes). Layers of metallization have been formed over device layer 112 by a build-up process to form metallization stack 114, interleaving metal layers 115 including, but not limited to, any of copper, aluminum, gold, silver, tungsten with dielectric layers 116 comprising dielectric materials including, but not limited to, silicon oxides, silicon nitrides, silicon oxynitrides, silicon carbide or silicon oxycarbides. Metal layers may be formed by any of sputtering, evaporation, chemical vapor deposition, electroplating or electroless plating processes. Dielectric layers may be formed by sputtering (e.g., RF sputtering of dielectric targets), chemical vapor deposition or spin-coating techniques (e.g., spin-on glass). Layer thicknesses may range between 50 nm to several microns. Formation of metallization stack 114 may be a back-end-of-line (BEOL) process in the chiplet fabrication line.

After metal layers are formed, chiplet wafer 400 is singulated, as indicated by the dashed vertical lines, to liberate individual chiplets 101. In some embodiments, semiconductor base 113 is thinned by grinding operation before singulation. Vias (e.g., through-device layer vias 121) may be formed after the thinning operation and before singulation.

Figure 6B:
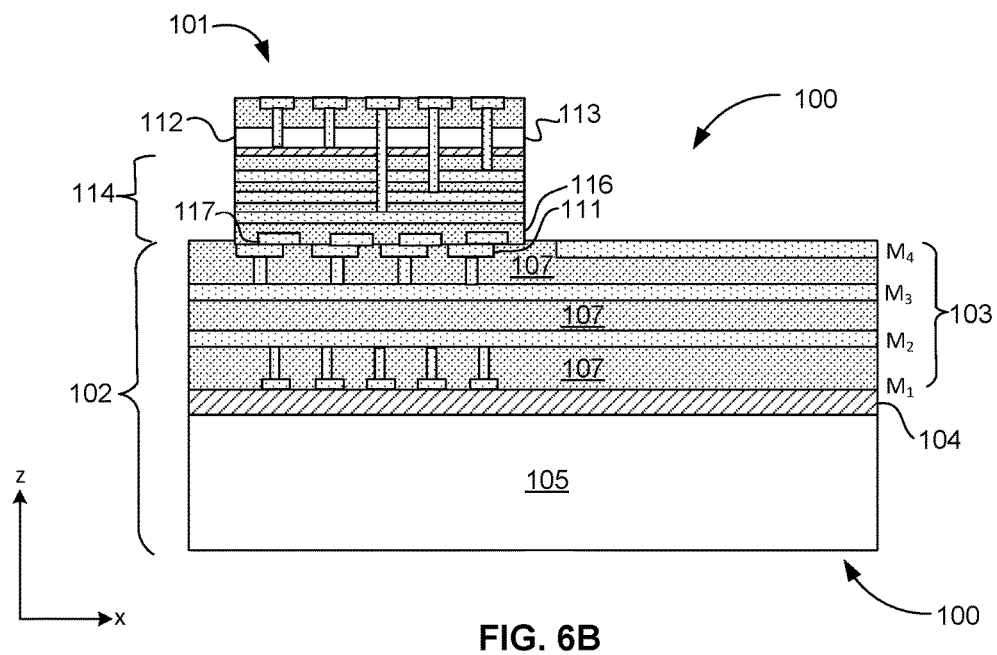

In FIG. 6B, singulated chiplets 101 may be introduced into the fabrication line for host dies 102 during the BEOL metallization stage. In a wafer-level pick-and-place operation, individual chiplets may be attached to host die 102. The pick-and-place operation may have an accuracy tolerance of several tens to hundreds of nanometers, and introduce some alignment offset between chiplet metallization pads 117 and BEOL metallization stack pads 111. In some embodiments, chiplet 101 is hybrid-bonded to host die 102 at wafer level. Hybrid bonding may be performed by pick and place operation followed by thermal anneal of the assembly comprising chiplet 101 and host die wafer 102. forms direct metal-to-metal bonds between pads 111 and 117, forming direct-bond interconnects, and molecular bonds between dielectric layers between chiplet interlayer dielectric 116 and BEOL interlayer dielectric 107.

Figure 6C:
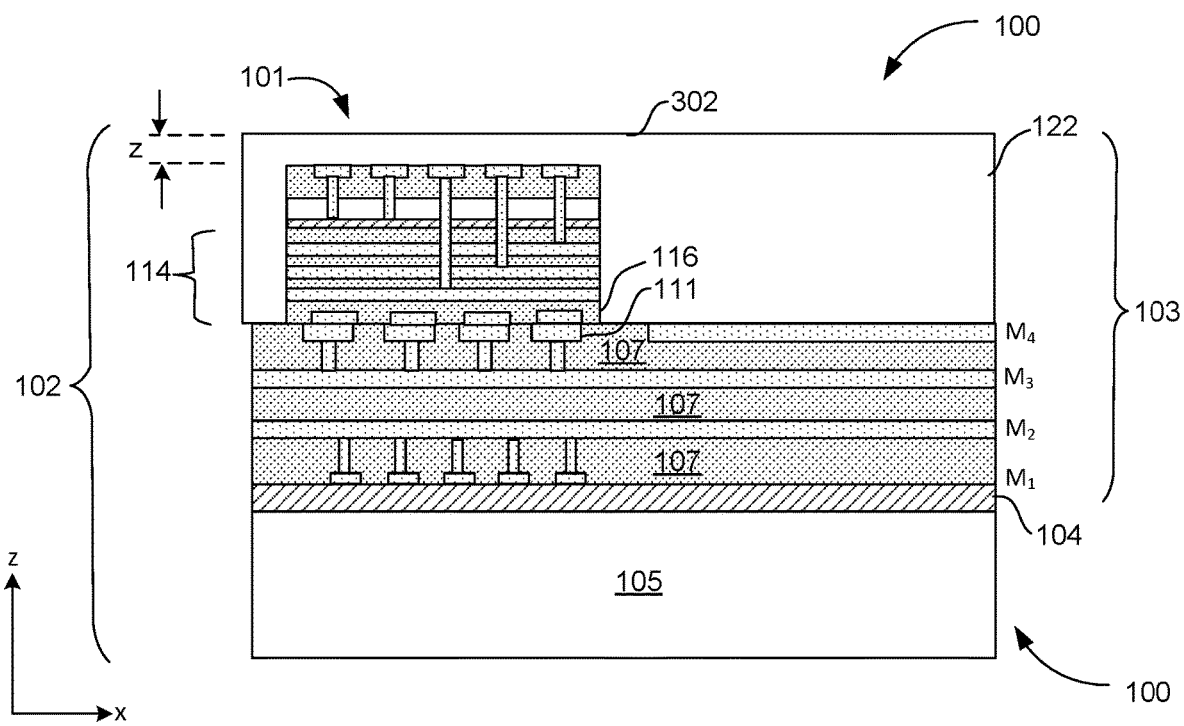

In FIG. 6C, BEOL metallization 103 build-up process is continued by deposition of fill dielectric 122 over attached chiplet 101 and BEOL metallization stack 103. Fill dielectric may comprise at least in part an amorphous silicate material that may be deposited by spin-coating an inorganic silica-based glass (e.g., spin-on glass, SOG). In alternate embodiments, fill dielectric 122 may be deposited by chemical vapor deposition processes such as plasma-enhanced chemical vapor deposition (PECVD) and low-pressure chemical vapor deposition (LPCVD).

Fill dielectric 122 may be deposited to z-height that is at least the z-height of attached chiplet 101. Depending on the z-height of chiplet 101, one or more coatings of fill dielectric 122 may be applied. Chiplet 101 may have a z-height that ranges between 10 and 20 microns. Excess fill dielectric material may form overlayer 402 that extends above chiplet 101. Overlayer 402 has a thickness z that is the difference between z-heights of fill dielectric 122 and chiplet 101.

Figure 6D:
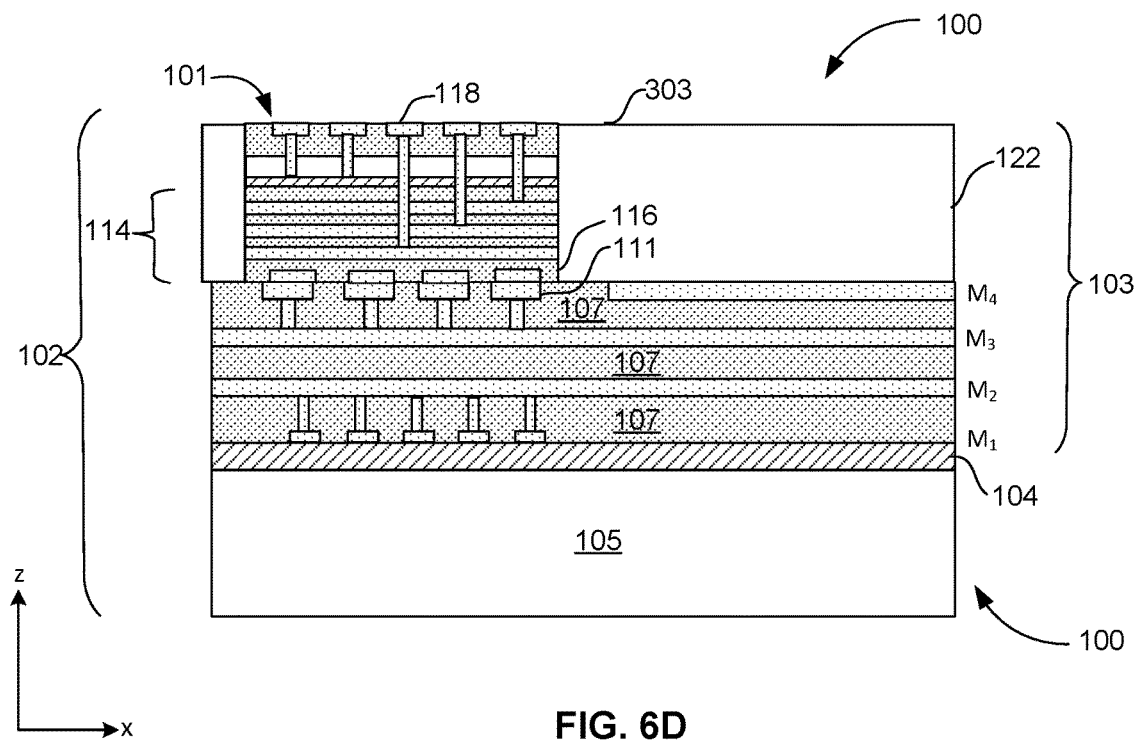

In FIG. 6D, a grind or polish operation (e.g., chemical-mechanical planarization, CMP) is performed to remove overlayer 402 and reveal pads 118 at the tops of extension vias 120 and through-device layer vias 121 of attached chiplet 101. The reveal process may prepare the stack for a new metallization level, where the top surface 402 of fill dielectric provides a platform for the next stack level. Pads 118 may be revealed to provide a surface to grow interconnecting vias through an additional dielectric or for direct bond interconnection of a second chiplet or interposer.

A CMP tool may be employed to remove the top portion of fill dielectric 122 and grind down to reveal pads 118. The process may remove up to several microns of fill dielectric overlayer 402 to planarize fill dielectric 122 with chiplet 101.

Figure 6E:
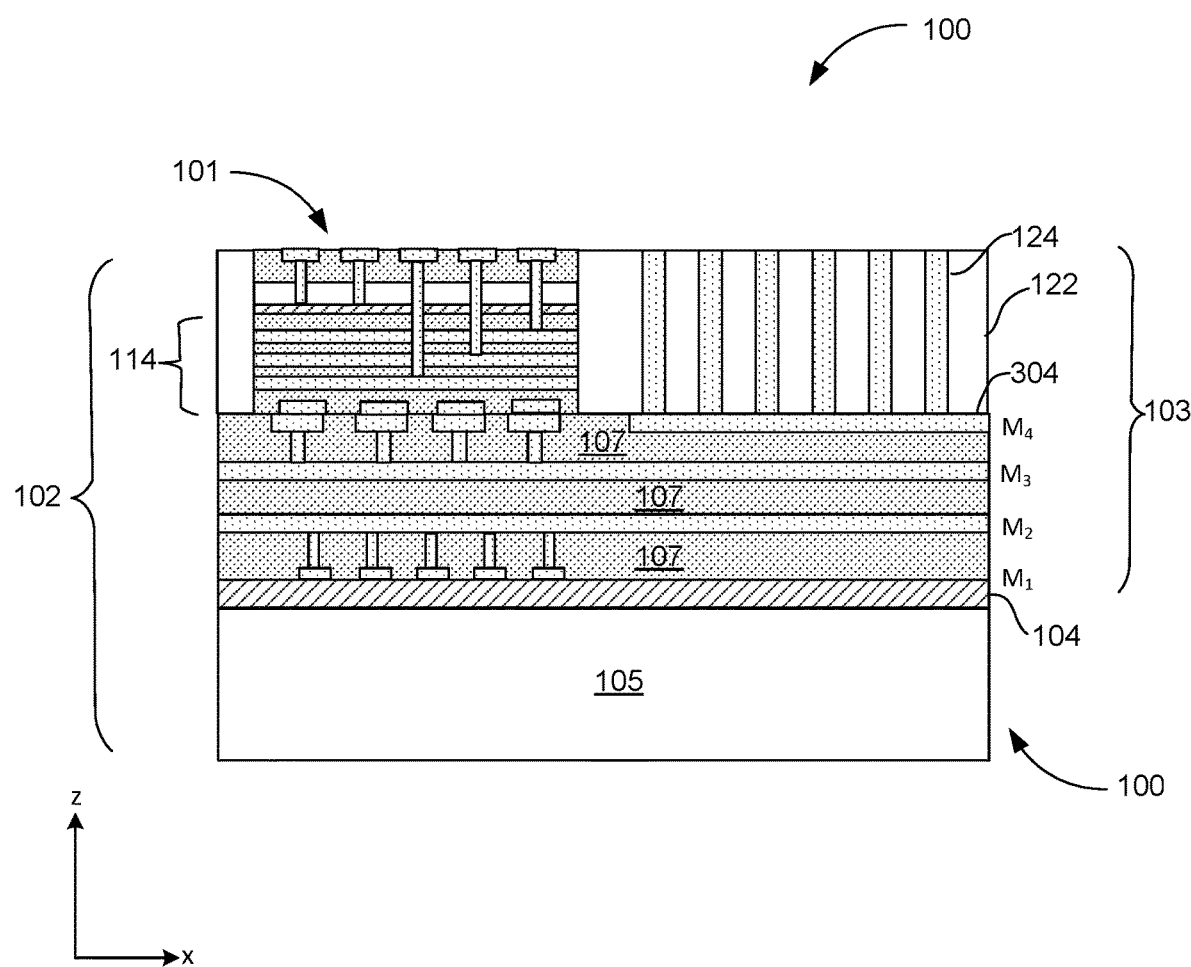

In FIG. 6E, through vias 124 are formed within a region of fill dielectric layer 122 adjacent to chiplet 101. High-aspect ratio via openings (not shown) may be patterned in fill dielectric layer 122 through a etch mask that may be a patterned photoresist layer or metal mask. Via openings may be formed by an etch process that may produce high-aspect ratio apertures with substantially straight sidewalls, such as deep reactive ion etch (DRIE) process (e.g., a Bosch process). Metal features in BEOL level M4 may serve as an etch stop, such as trace 404.

Several suitable metal deposition processes may be employed to produce through-vias 124 with the formed via openings. Copper, gold, silver, cobalt and nickel are metals suitable for electroplating. Electroplating may be employed to grow vias 124 from the bottom of the via openings at metallization level M4, where one or more features such as trace 304 may be employed as a cathode. The etch mask employed to form via openings may also be employed as a plating mask. Alternatively, electroless deposition within via openings may be employed to produce through-vias 124. A catalytic seed layer comprising palladium may be formed before the electroless deposition step employing a solution of the metal, such as copper or gold.

Figure 6F:
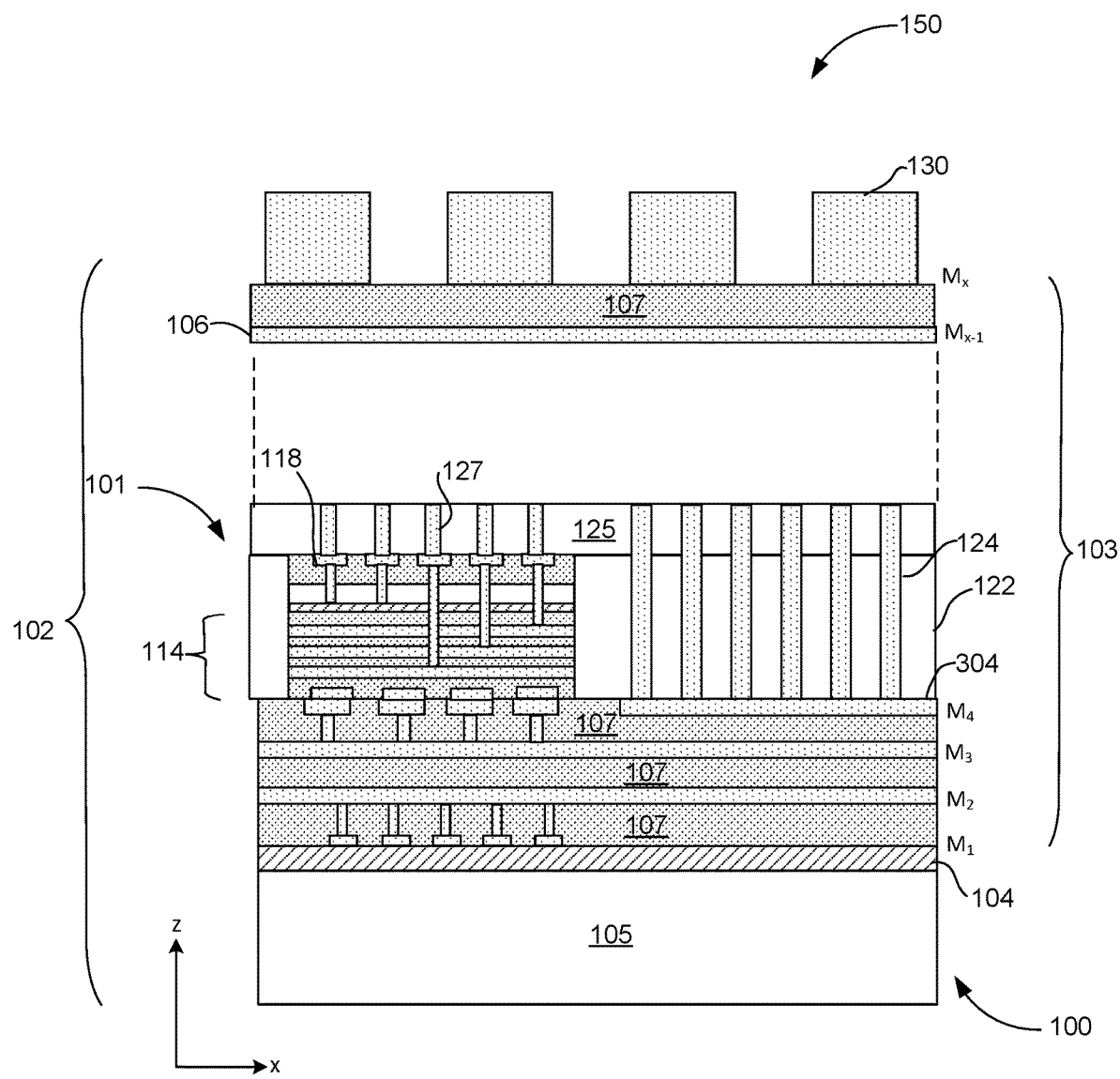

In FIG. 6F, dielectric overlayer 125 is optionally deposited over chiplet 101 and fill dielectric 122 to extend chiplet backside pads 118 and through-vias 124 producing composite die structure 150 shown in FIG. 1A. Extension vias 127 may be formed through dielectric overlayer 125 above backside pads 118 of chiplet 101 to enable interconnection with upper metallization levels (not shown). Similarly, through vias 124 may be extended through overlayer 125. In operations similar to the formation of through vias 124 in fill dielectric 122 adjacent to chiplet 101, via openings may be created over chiplet backside pads 118 and through-vias 124.

Alternatively, the planarization operation shown in FIG. 4D may be omitted, or limited to grinding fill dielectric 122 to produce a desired overlayer z-height over chiplet 101. Via openings may be formed over backside pads 118 and in the region adjacent to chiplet 101 for formation of through vias 124. Metal may be deposited in via openings as described above, forming through-vias 124 and extension vias 127. Other metals such as, but not limited to cobalt and titanium, may be deposited over extension vias 127 to form diffusion barriers over backside pads 118.

Figure 7A:
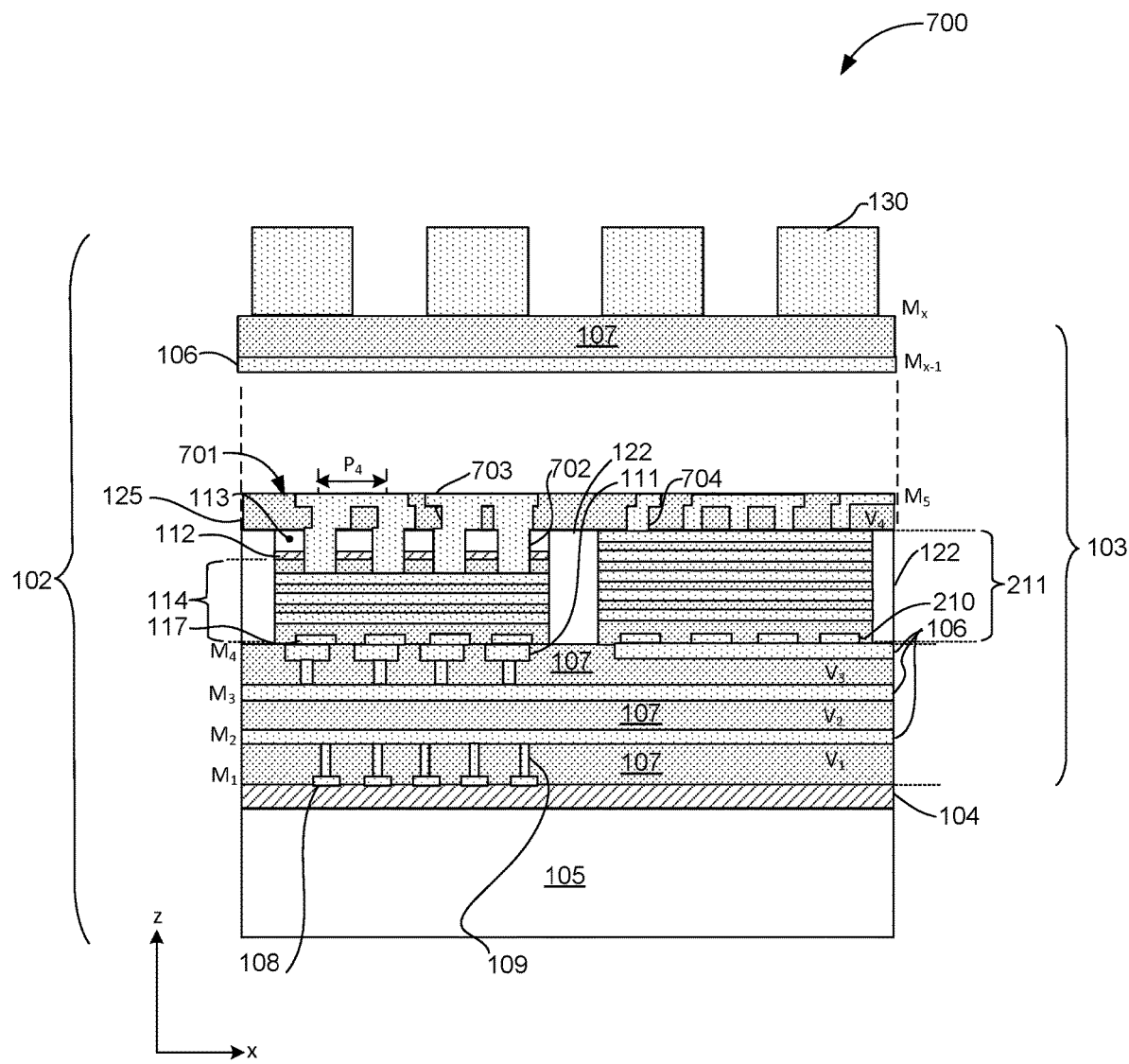
FIG. 7A illustrates a cross-sectional view in the x-z plane of a composite chip structure, according to some embodiments of the disclosure.

FIG. 7A illustrates a cross-sectional view in the x-z plane of a composite die structure 700, according to some embodiments of the disclosure.

Composite die structure 700 comprises chiplet 701 and passive interconnect chiplet 211 (e.g., an interposer) embedded within BEOL metallization stack 103 on host die 102. In some embodiments, chiplet 701 and passive interconnect chiplet 211 are hybrid bonded to BEOL metallization level M4. A hybrid bond may be characterized as having diffusion bonds between pads 117 on the top metal level of chiplet metallization stack 114 and pads or lines 111 in BEOL metal level M4 of host die 102. Dielectric materials in opposing metallization stacks are atomically bonded at their interface. In some embodiments, dielectric materials in the opposing metallization stacks are substantially the same as those in embodiments described above.

Chiplet 701 comprises multiple through-device layer vias (TDVs) 702 extending from contact pads 703 on backside bulk semiconductor 113 to metallization levels in stack chiplet metallization stack 114. TDVs 702 may have diameters greater than 1000 nm (e.g., 1 micron) to several microns. In comparison to through-device layer vias 121 in chiplets 101, TDVs 702 may be substantially larger. Feature pitch P4 between TDVs 702 may be significantly larger than pitch P3 between smaller through-device layer vias 121 and vias 120 in FIG. 1A to accommodate the relatively larger diameter of TDVs 702. P4 may be measured in terms of microns. The larger TDVs may result in lower transistor density in device layer 112, however they may provide alternative advantages such as higher current carrying capability and lower resistance. They may also simplify the previous fabrications steps of the chiplet 701. The larger size of TDVs 702 relative to through-device layer vias 121 may also facilitate larger alignment tolerances for chiplet placement on host chip 102 in pick-and-place operations, which may have movement accuracy tolerances of several microns. The center-to-center offset indicated in the figure between TDVs 702 and interconnect vias 703 in via layer V4 extending through dielectric 125 shows an example of chiplet placement misalignment relative mask alignment to markers and other features in metallization level M5. Similar dimensions may be employed for vias 704 over passive interconnect chiplet 211 to relax alignment tolerances. As for through-device layer vias 121, TDVs 702 may route power and I/O data signals from upper BEOL metallization layers in BEOL stack 103 (e.g., M5) to circuitry on host die 102 directly underlying chiplet 701, enabling more direct routing with reduction of parasitics, latencies and losses relative to more circuitous routing architecture that would be necessary for an opaque chiplet.

Figure 7B:
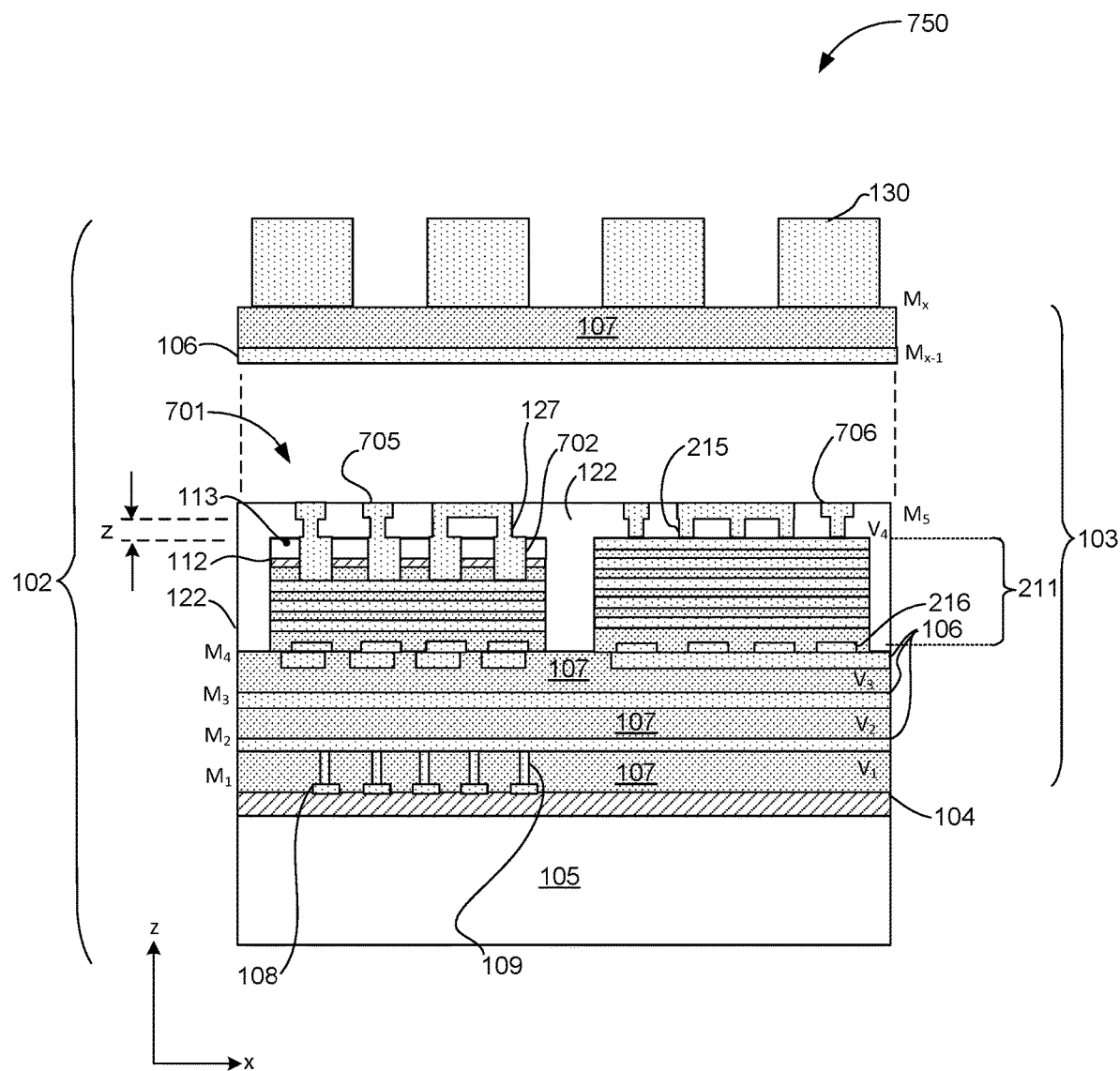
FIG. 7B illustrates a cross-sectional view of a composite chip structure comprising alignment compensation vias, according to some embodiments of the disclosure.

FIG. 7B illustrates a cross-sectional view of composite die structure 750 comprising alignment compensation vias 127, according to some embodiments of the disclosure.

In FIG. 7B, fill dielectric 122 has a z-height greater than the z-heights of chiplet 701 and passive interconnect chiplet 211. Tops of through-device layer TDVs 702 of chiplet 701 are covered by fill dielectric 122, and extended to the top of fill dielectric 122 by smaller alignment compensation vias 127. Fill dielectric 122 may be planarized to a distance z above chiplet 701. Alignment compensation vias 127 may be formed in the layer of fill dielectric 122 above chiplet 701 within via level V4, and aligned to both TDVs 702 (with loose alignment tolerance) and with tighter alignment tolerance to features in metallization level M5 above chiplet 701 and passive interconnect chiplet 211. Alignment compensation vias 127 in via level V4 interconnect TDVs 702 to features 705 in M5. The dielectric architecture shown in FIG. 7B may eliminate the need of an ILD deposition operation in the fabrication process. Alignment compensation vias 127 may be center-aligned to features 705 but off-center with respect to misaligned TDVs 702, enabling precision alignment of TDVs 702 to features 705 formed subsequently in level M5.

Passive interconnect chiplet 211 may be similarly misaligned due to placement accuracy limits. Alignment compensation vias 215 extending through a layer of fill dielectric 122 above passive interconnect chiplet 211 may be precision-aligned to features 706 in level M5 and interconnect misaligned features on the top layer of passive interconnect chiplet 211 (not shown) to features 706.

Figure 7C:
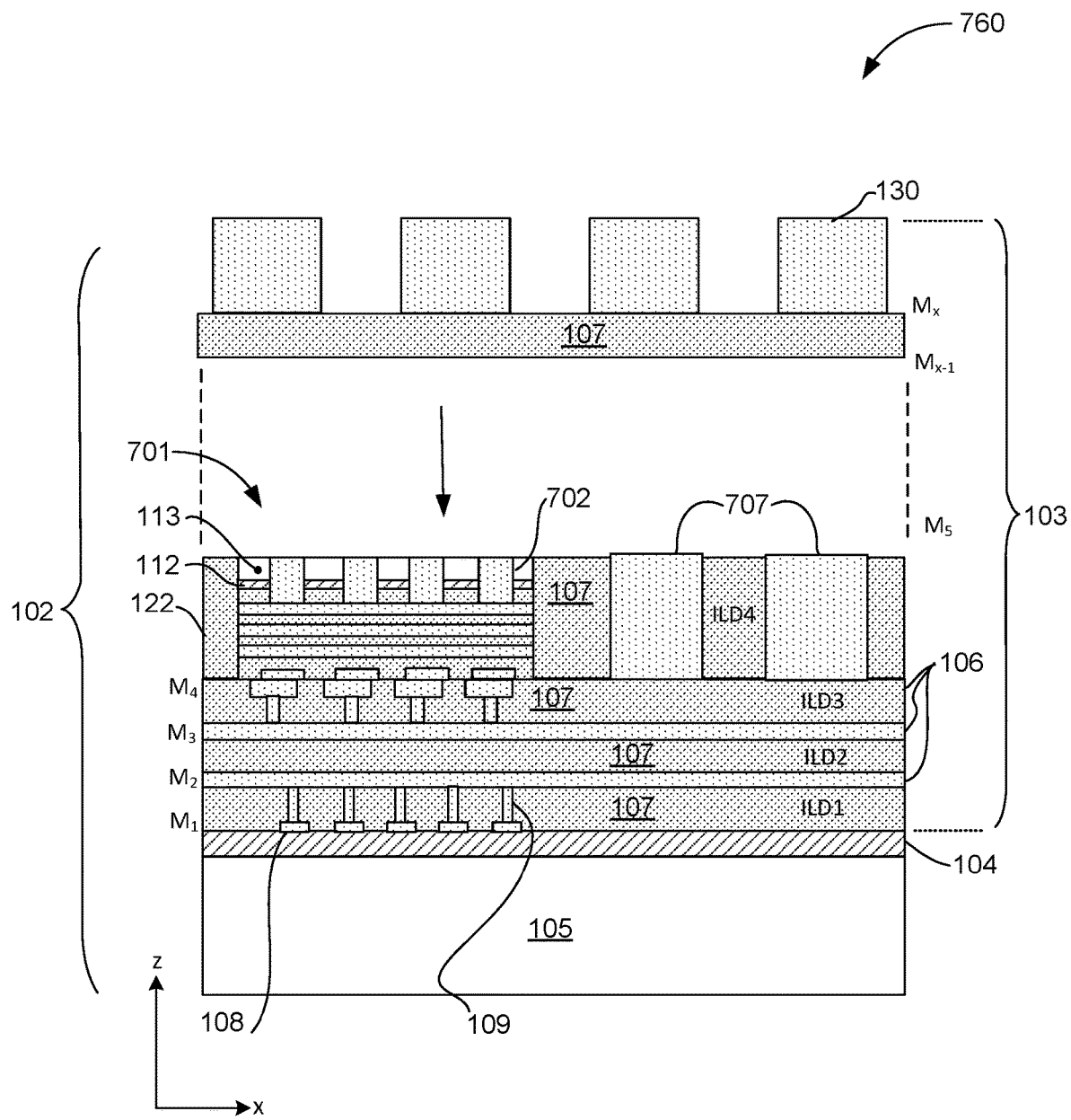
FIG. 7C illustrates a cross-sectional view of composite chip embedded in a thick metallization layer, according to some embodiments of the disclosure.

FIG. 7C illustrates a cross-sectional view of composite die 760 embedded in a thick metallization layer, according to some embodiments of the disclosure.

In the illustrated embodiment, ILD 107 level 4 (ILD4) within BEOL metallization stack 103 comprises buried thick metallization features 707 shown adjacent to chiplet 701, and have a z-height equal to or greater than the z-height of chiplet 701. In some embodiments, thick metallization features 707 are trench vias that extend in the y-dimension above and below the plane of the figure. In some embodiments, thick metallization features are large-diameter power distribution interconnect vias. Chiplet 701 is shown embedded within ILD4 in the vicinity of thick metallization features 707, but may ha As shown, chiplet 701 may be somewhat misaligned relative to metallization features in level M4 and lower levels in BEOL metallization stack 103 due to imprecise placement on host die 102. However, in the illustrated embodiment TDVs 702 are aligned to metallization features 705 in M5. In the illustrated embodiment, TDVs 702 have been formed subsequent to chiplet attachment, enabling precise alignment (within design tolerances) of TDVs 702 to metallization features 705 in M5.

Figure 8A:
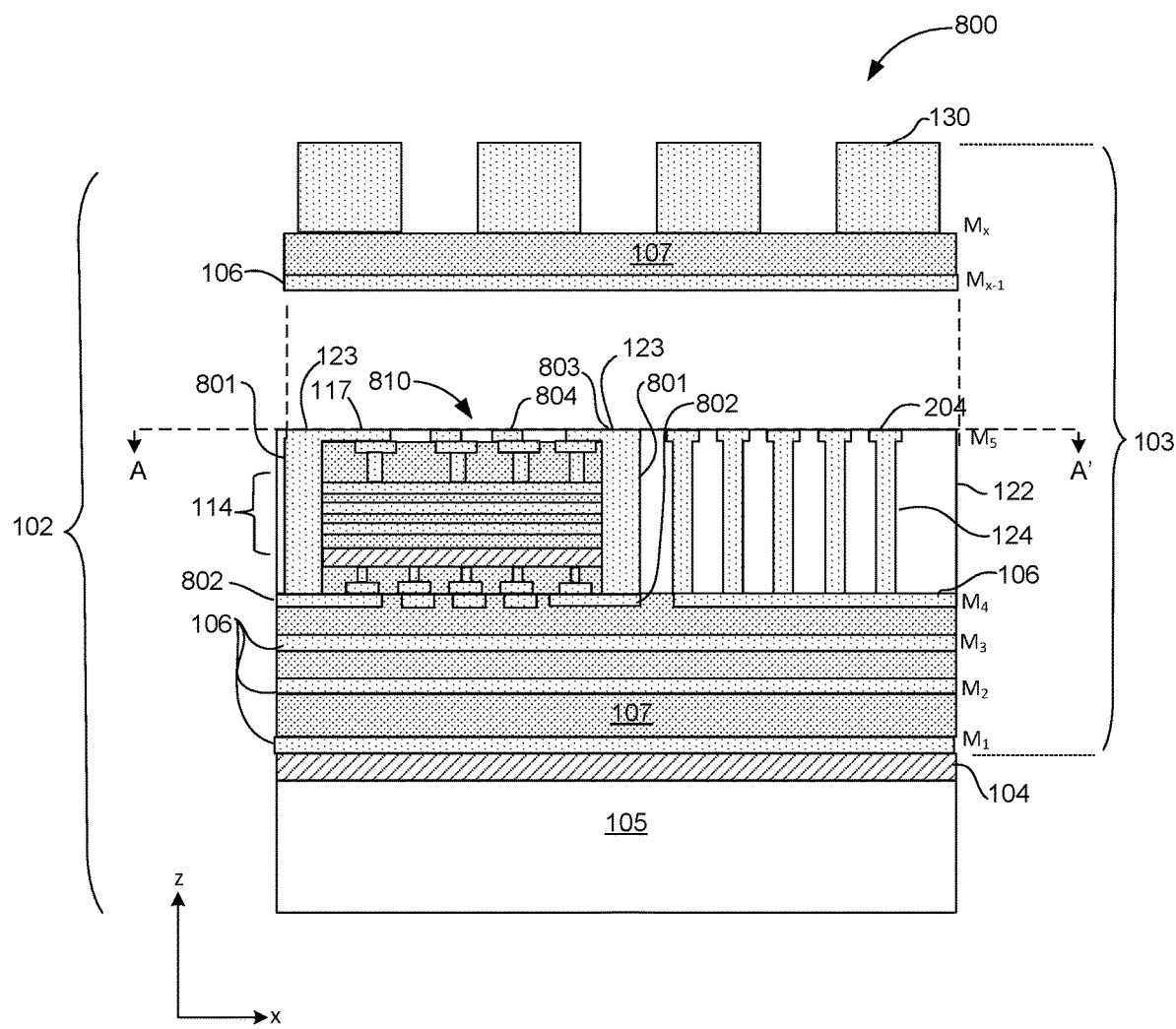
FIG. 8A illustrates a cross-sectional view of a composite chip structure comprising cantilevered vias, according to some embodiments of the disclosure.

FIG. 8A illustrates a cross-sectional view of composite die structure 800, comprising cantilevered vias 801, according to some embodiments of the disclosure.

In composite die structure 800, cantilevered vias 801 are adjacent to sidewalls 123 of chiplet 101, extending across the z-height of chiplet 101, from features 802 in M4 in BEOL metallization stack 103 to metallization features 803 in level M5 over chiplet 101. In the cross-sectional view, two cantilevered vias 801 are shown, having a rectangular cross section in the x-z plane and extending in the y dimension (above and below the plane of the figure). In some embodiments, cantilevered vias 801 are high-aspect ratio structures, having a z-height several times the width in the x dimension. Cantilevered vias 801 may be employed to couple power from M5 (ultimately from FLIs 130) to circuitry on host die 102, and may have a large cross section in the x-y plane to provide a low-resistance path to accommodate large current flow. The extent of cantilevered vias 801 in the x dimension may be adjusted to maximize the cross-sectional area for lowest resistance. Any number from one to four of cantilevered vias 801 may be adjacent to chiplet 101. The two cantilevered vias 801 shown in FIG. 8A extend along sidewalls 123 in the y dimension above and below the plane of the figure. In some embodiments, a third cantilever via and a fourth cantilever via (not shown) may extend along opposing sidewalls of chiplet 101 in the x dimension, orthogonal to cantilevered vias 801, as shown as cantilevered vias 804 in FIGS. 8B and 8C.

Cantilevered vias 801 may comprise suitable metals such as, but not limited to, copper, aluminum, gold, nickel, cobalt, platinum, palladium, tungsten, titanium and tantalum. The latter valve metals may be employed in barrier layers. In some embodiments, the fill metal (e.g., copper or copper-aluminum) may be annealed to improve conductivity.

Cantilevered vias 801 may interconnect metallization features below chiplet 101 (e.g., metallization feature 802 in M4) to metallization features above chiplet 101 (e.g., metallization feature 803 in M5). Due to the close proximity to chiplet 101, cantilevered vias 801 may enable low-loss routing of large scale power to host die circuitry that is directly under chiplet 101. Cantilevered vias 801 may provide an alternative to TDVs (e.g., TDVs 702 in FIG. 7A and 121 in FIG. 1A), having less impact on chiplet transistor density and providing a lower resistance path for high power delivery.

Figure 8B:
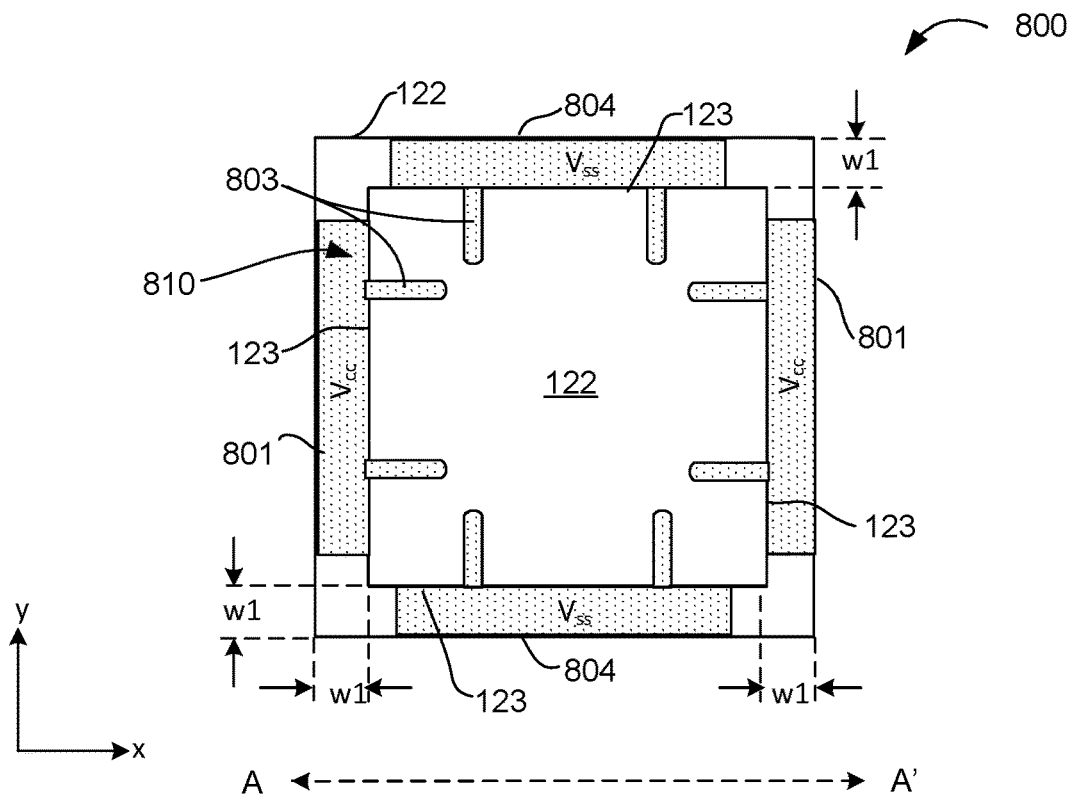
FIG. 8B illustrates a plan view in the x-y plane of a composite die structure having chiplet symmetrically aligned with cantilevered vias, according to some embodiments of the disclosure.

FIG. 8B illustrates a plan view in the x-y plane of composite die structure 800 having chiplet 101 symmetrically aligned with cantilevered vias 801 and 804, according to some embodiments of the disclosure.

In the plan view of FIG. 8B, taken along plane A-A' in FIG. 8A, additional cantilevered vias 804 running orthogonal to cantilevered vias 801 (shown in cross-section in FIG. 8A), but are substantially identical to cantilevered vias 801 in other respects. In the illustrated embodiment, each of the four sidewalls 123 of chiplet 101 are immediately adjacent to a cantilevered via (e.g., 801 and 804). Although not shown, a barrier layer may be between cantilevered vias 801 and 804 and sidewalls 123 to prevent diffusion of metals such as copper into chiplet dielectric materials (e.g., ILD 116 and fill dielectric 122) or semiconductor (e.g., semiconductor material 113). Metallization structures 803, depicted as traces in the illustrated embodiment over fill dielectric 122, are connected to cantilevered vias 801 and 804. Metallization structures 805 may couple power to power rails (not shown) on chiplet 101. During operation, cantilevered vias 801 and 804 may be coupled to positive and negative power supply terminals, respectively, as indicated by the Vcc and Vss designations. In the arrangement shown, cantilevered vias 801 are coupled to a Vcc supply, while orthogonal cantilevered vias 804 are coupled to a Vss supply.

Cantilevered vias 801 and 804 may be self-aligned to chiplet 101. In the example shown in the illustrated embodiment of FIG. 8B, chiplet 101 is substantially symmetrically aligned with respect to cantilevered vias 801 and 804. Widths w1 and w2 of cantilevered vias 801 and 804, respectively, are substantially equal.

Figure 8C:
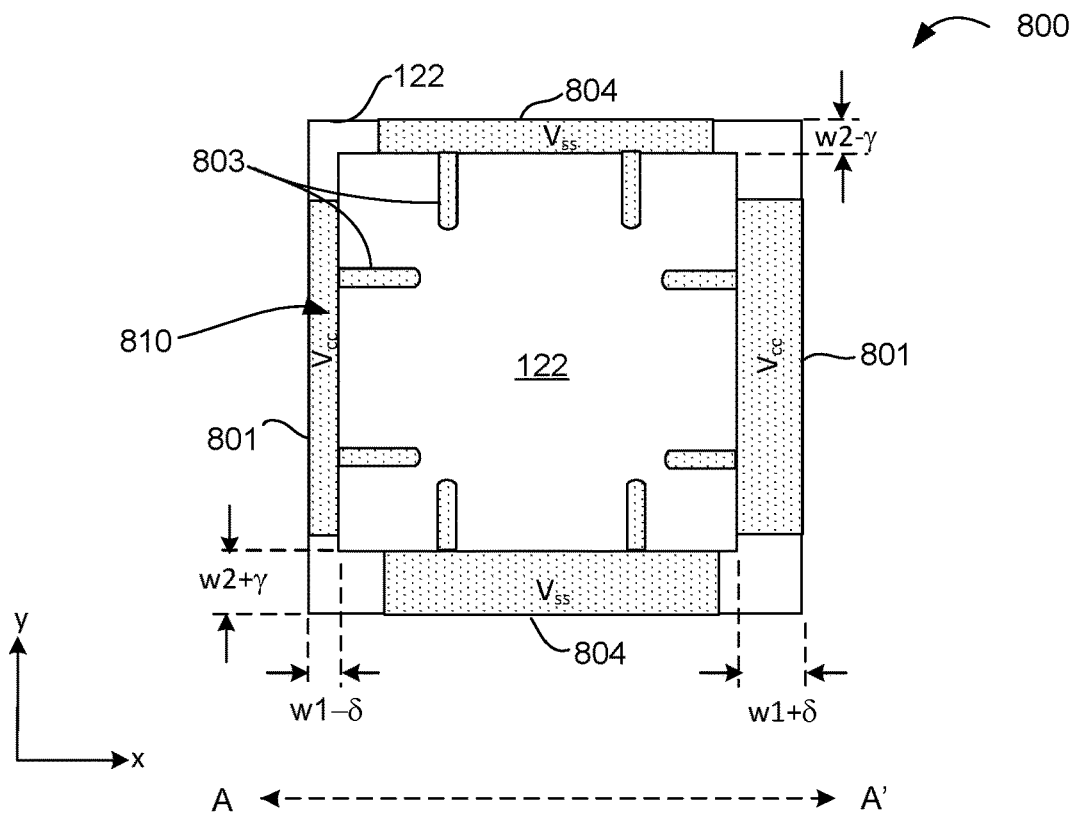
FIG. 8C illustrates a plan view in the x-y plane of composite die structure, having some misalignment of chiplet with respect to cantilevered vias, according to some embodiments of the disclosure.

FIG. 8C illustrates a plan view in the x-y plane of composite die structure 800, having some misalignment of chiplet 101 with respect to cantilevered vias 801 and 804, according to some embodiments of the disclosure.

The plan view of FIG. 8C is taken along plane A-A' in FIG. 8A. The placement of chiplet 101 is misaligned with respect to cantilevered vias 801 and 804, overlapping the cantilevered via sidewalls. The indicated dimensions show a first displacement δ of chiplet 101 to the left in the figure in the x dimension, and a second displacement γ upward in the y dimension of the figure. Cantilevered vias 801 and 804 are self-aligned to chiplet 101, where the loss of width w2 by the amount γ in the upper cantilevered via 804 is compensated by the gain in width by the same amount γ in the lower cantilevered via 804. Similarly for cantilevered vias 801, the loss of width w1 by an amount δ by the left-side (in the figure) cantilevered via 801 is compensated by the gain in w1 by δ on the right-side (in the figure) cantilevered via 801. In this manner, the total resistance of the via pairs (e.g., Vcc and Vss) remain substantially constant for different amounts of misalignment of chiplet 101 within limits. The self-alignment capability of cantilevered vias 801 and 804 may enable relaxed alignment tolerances of chiplet 101 placement.

Figure 9:
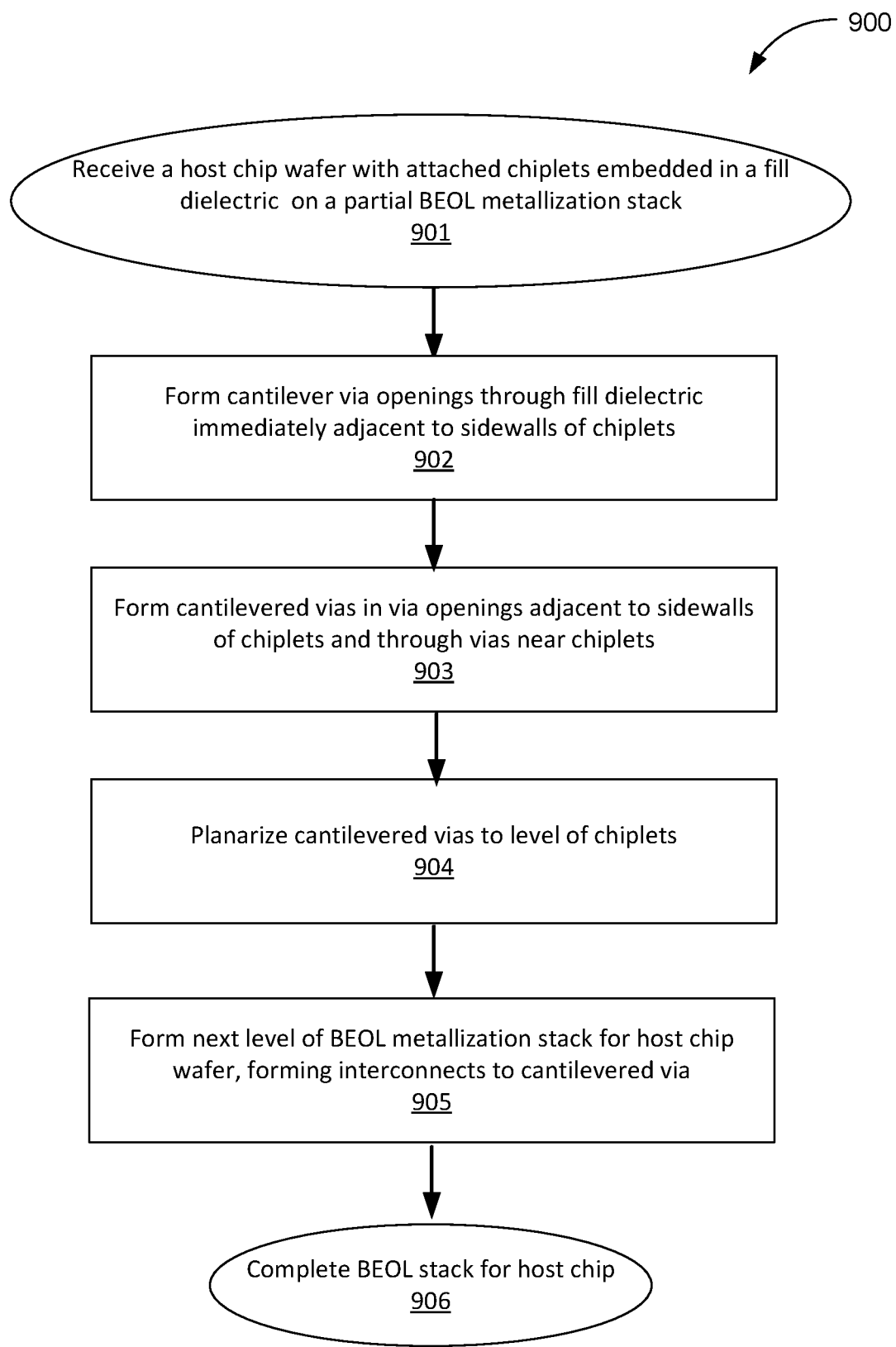
FIG. 9 illustrates a process flow chart summarizing an exemplary method for making a composite chip structure, according to some embodiments of the disclosure.

FIG. 9 illustrates process flow chart 900 summarizing an exemplary method for making composite die structure 800, according to some embodiments of the disclosure.

At operation 901, a host die wafer is received having a partially complete BEOL metallization stack with one or more chiplet dies (e.g., chiplets 101) placed and attached to the upper-most metallization level of the stack in a previous operation for each host die on the host die wafer. The chiplet dies may be embedded in a fill dielectric (e.g., fill dielectric 122) over the partially completed BEOL metallization stack.

At operation 902, a wafer-level process is employed to etch trenches in the fill dielectric adjacent to one or more sidewalls of the chiplet dies by an anisotropic etch process to form high-aspect ratio trenches. Trenches may be etched though rectangular hard etch mask openings that overlap or fully encompass the chiplet dies. Due to placement tolerances, chiplets may be slightly misaligned with respect to etch mask features. The fill dielectric may be etched completely through to the top of the BEOL stack. The top of chiplets may comprise an etch stop material so that only fill dielectric material surrounding the chiplets will be removed without damaging the chiplet.

At operation 903, a wafer level process is employed to fill the etched trenches with a suitable metal, such as copper or copper-aluminum alloy, to form cantilevered vias (e.g., cantilevered vias 801 and 804). A conformal barrier layer may be formed over the trench sidewalls before the metal fill operation to prevent diffusion of metal atoms to adjoining structures in both chiplets and host dies. Cantilevered vias may be grown to interconnect metallization structures on the frontside of the chiplet (e.g., metallization features 803) to metallization structures on the backside of the chiplet (e.g., metallization features 802). Cantilevered vias may be grown to interconnect features in lower host die BEOL metallization levels below the attached chiplet, with features in upper host die BEOL metallization levels.

Trenches may be filled to overflow, where some metallization structures interconnected by the cantilevered vias may be formed by lateral overgrowth from the tops of the trench vias and patterned by metal etch subsequently. Other features may be formed at the top of the fill dielectric by a Damascene process as those described above, creating a new metallization level in the BEOL metallization stack.

At operation 904, a planarization process is employed to remove excess metal from metallization features at the newly-formed top metallization level and create a uniform z-height for all metallization structures in the top level of the BEOL stack, including cantilevered vias.

At operation 905, build-up of the BEOL stack continues. Higher metallization levels bury the cantilevered vias within the BEOL stack. Larger metallization features, for example, power-routing structures in the higher BEOL stack levels, may be coupled to the cantilevered vias through interlevel vias. The build-up process may be recursive for deposition of dielectrics and metals employed in each succeeding level. In some embodiments, a second chiplet attach may be performed at a higher metallization level. Cantilevered vias may be formed adjacent to the second chiplets for power routing to host die circuitry below the second chiplets.

At operation 906, BEOL stack is completed, completing formation of composite die structures (e.g., composite die structure 800). One or more metallization layers may be formed over the attached chiplets and cantilever vias grown adjacent to the attached chiplets, burying them within the BEOL stack. First level interconnects (e.g., FLIs 130) are formed at the top level of the BEOL stack to enable mounting of the composite die structure to a package substrate or an interposer.

FIGS. 10A-E illustrate cross-sectional views in the x-z plane of an exemplary process for making a composite die structure 800 summarized in the process flow 900, according to some embodiments of the disclosure.

Figure 10A:
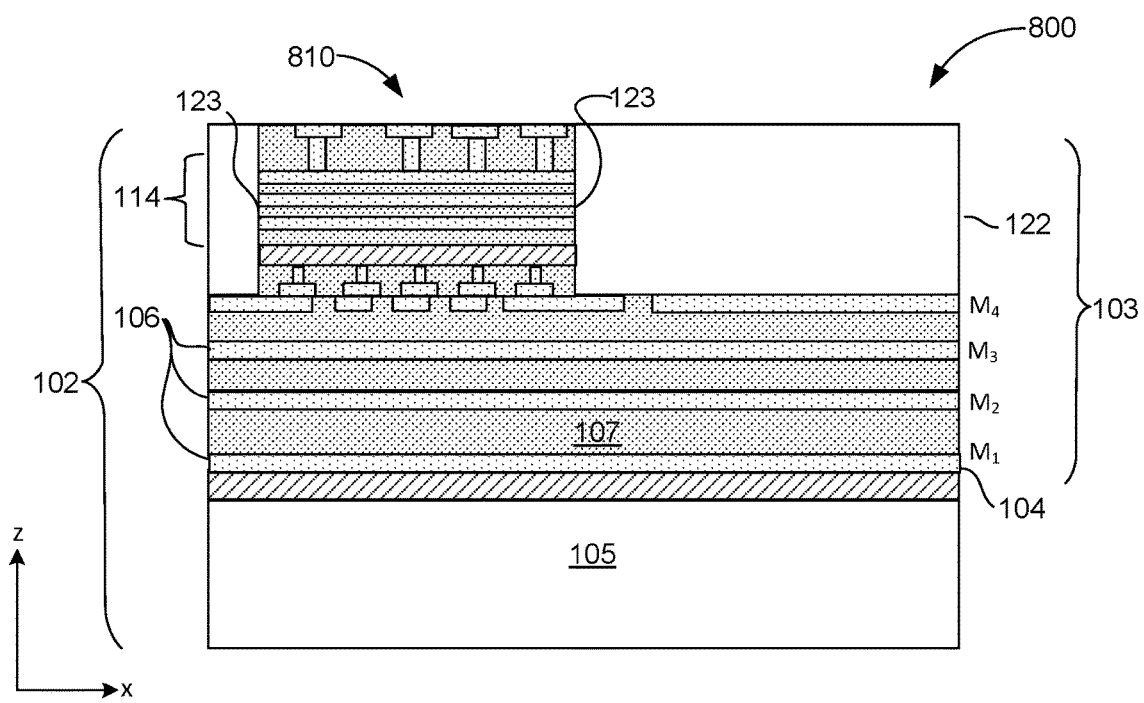
FIGS. 10A, 10B, 10C, 10D, and 10E illustrate cross-sectional views in the x-z plane of an exemplary process for making a composite chip structure summarized in the process flow shown in FIG. 9, according to some embodiments of the disclosure.

FIG. 10A illustrates a cross-sectional view of host die 102 (received unsingulated from the wafer) comprising chiplet 810 bonded to M4 of BEOL metallization stack 103 on host die 102. Chiplet 101 is embedded in fill dielectric 122. While a single chiplet 810 is shown, multiple chiplets may be attached to BEOL stack 103 on host die 102. The top metallization level shown is M4, but chiplet 810 may be attached at any suitable level within the BEOL stack. The operations described below may be repeated for multiple chiplets attached to a single level within the BEOL metallization stack or at separate levels.

Figure 10B:
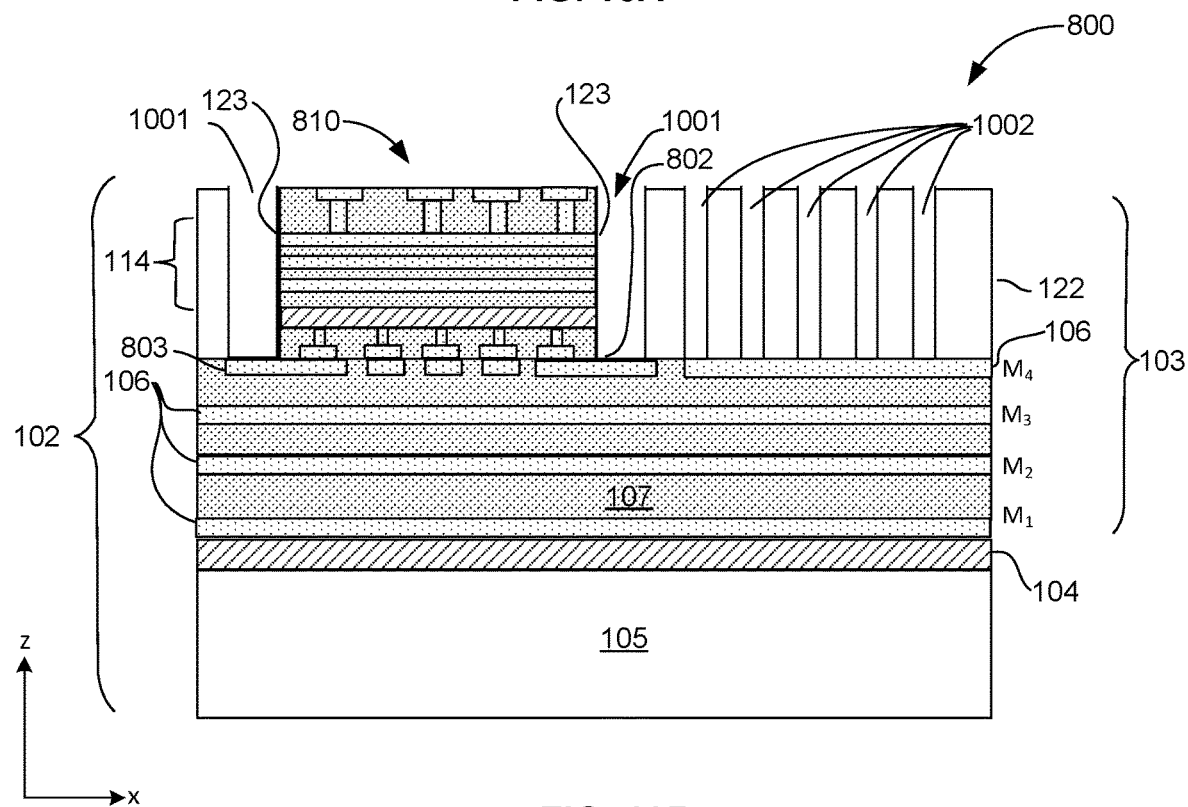

FIG. 10B illustrates the formation of trenches 1001 adjacent to chiplet 810. Trenches 1001 are high-aspect ratio apertures made in fill dielectric 122. Trenches 1001 extend from the top of fill dielectric 122 to the top of BEOL stack 103, revealing metallization structures 803 in M4 (top level). Trenches 1001 have substantially straight sidewalls, and may be formed by an anisotropic dry etch process capable of producing straight etch structures, such as a DRIE etch as described above. Trenches 1001 may be etched through a hard mask having rectangular apertures overlapping or fully encompassing the sidewalls of chiplet 810. The top of chiplet 810 may comprise a material capable of performing as an etch stop, such as silicon nitride. The etch-resistant top of chiplet 810 may function as part of the trench aperture of the etch mask, where its rectangular footprint may define the inner sidewalls of trenches 1001. A degree of chiplet misalignment may be tolerated by self-alignment of the trenches 1001 to chiplet 810.

Trenches 1001 may be etched through fill dielectric 122 to the top of BEOL stack 103. The z-height of trenches 1001 may be approximately equal to the z-height of chiplet 101. In some embodiments, fill dielectric 122 may have a z-height that exceeds the z-height of chiplet 101 to embed other attached structures, such as a passive die (e.g., passive interconnect chiplet 211). Fill dielectric 122 may have a z-height that exceeds the z-height of chiplet 101. The z-height of trenches 1001 may then be greater than the z-height of chiplet 101. Z-heights of trenches 1001 may be up to 20 microns from the top of BEOL stack 103 to the top of fill dielectric 122. The width of trenches 1001 may extend in the x dimension up to 20 microns from sidewalls 123. The length of trenches extends in the y dimension above and below the plane of the figure up to the length of sidewalls 123 of chiplet 810 (e.g., 100 microns).

In some embodiments, through-via openings 1002 are formed simultaneously with trenches 1001. Through-via openings 1002 may be cylindrical or rectangular in cross-section, having a diameter or width ranging up to 1000-2000 nm. In the illustrated embodiment, through-via openings 1002 are formed in over a portion of BEOL metallization stack 103 that is immediately adjacent to chiplet 810. In alternate embodiments, through via openings 1002 are formed over a more distant portion of BEOL metallization stack.

Figure 10C:
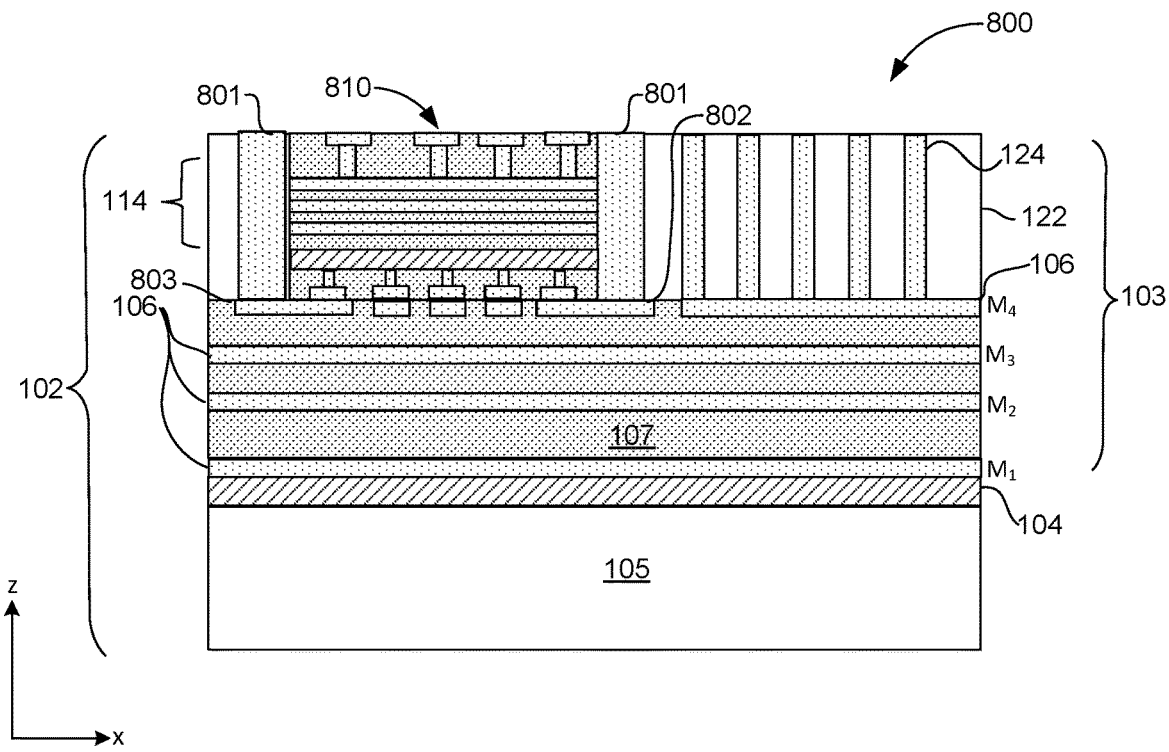

FIG. 10C illustrates the formation of cantilevered vias 801 by a fill operation of trenches 1001. Trenches 1001 may be filled by a metal deposition process such as metal CVD, electroless deposition or galvanic electroplating of suitable metals such as, but not limited to, copper, copper-aluminum alloy, aluminum, nickel, gold and silver. A thin barrier layer (e.g., 1-10 nm) comprising any of titanium, tantalum, tungsten and/or their nitrides, may be pre-formed before bulk metal deposition by thin film deposition methods such as evaporation or sputtering. A thin copper or nickel seed layer formed by similar physical deposition techniques may be present for initiating electroplating of bulk metal, or performing as a nucleation surface for CVD of metal into trenches 1001.

Through-via openings 1002 may be filled during the same fill operation, forming through vias 124 simultaneously with the formation of cantilevered vias 801. Sidewalls of through-via openings 1002 may also be coated with a barrier layer, followed by a seed layer.

Figure 10D:
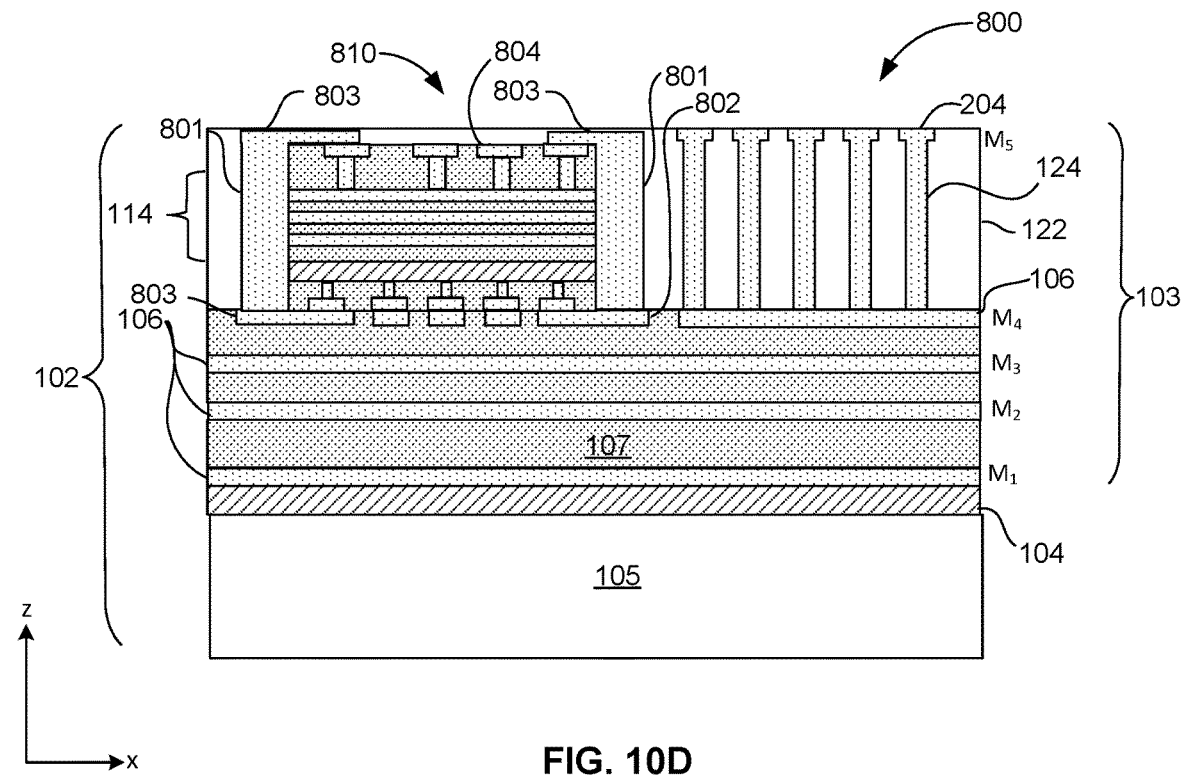

FIG. 10D illustrates the formation of metallization level M5 and formation of metallization features in M5. Through-vias 124 are grown within through-via openings 1002, interconnecting metallization features 106 in level M4 to pads 3 in level M5. Pads 203 may form as overhangs from lateral overgrowth onto the top of fill dielectric 122 after growth of through-vias 124 to the top of fill dielectric 122. Metallization features in level M5 may be formed by sheet deposition of a metal layer over the top surface of fill dielectric 122 after formation of cantilever vias 801 and through-vias 124, and subsequent patterning of the metal layer. In some embodiments, pads 203 are formed by a lithographic metal etch process of the metal layer.

Figure 10E:
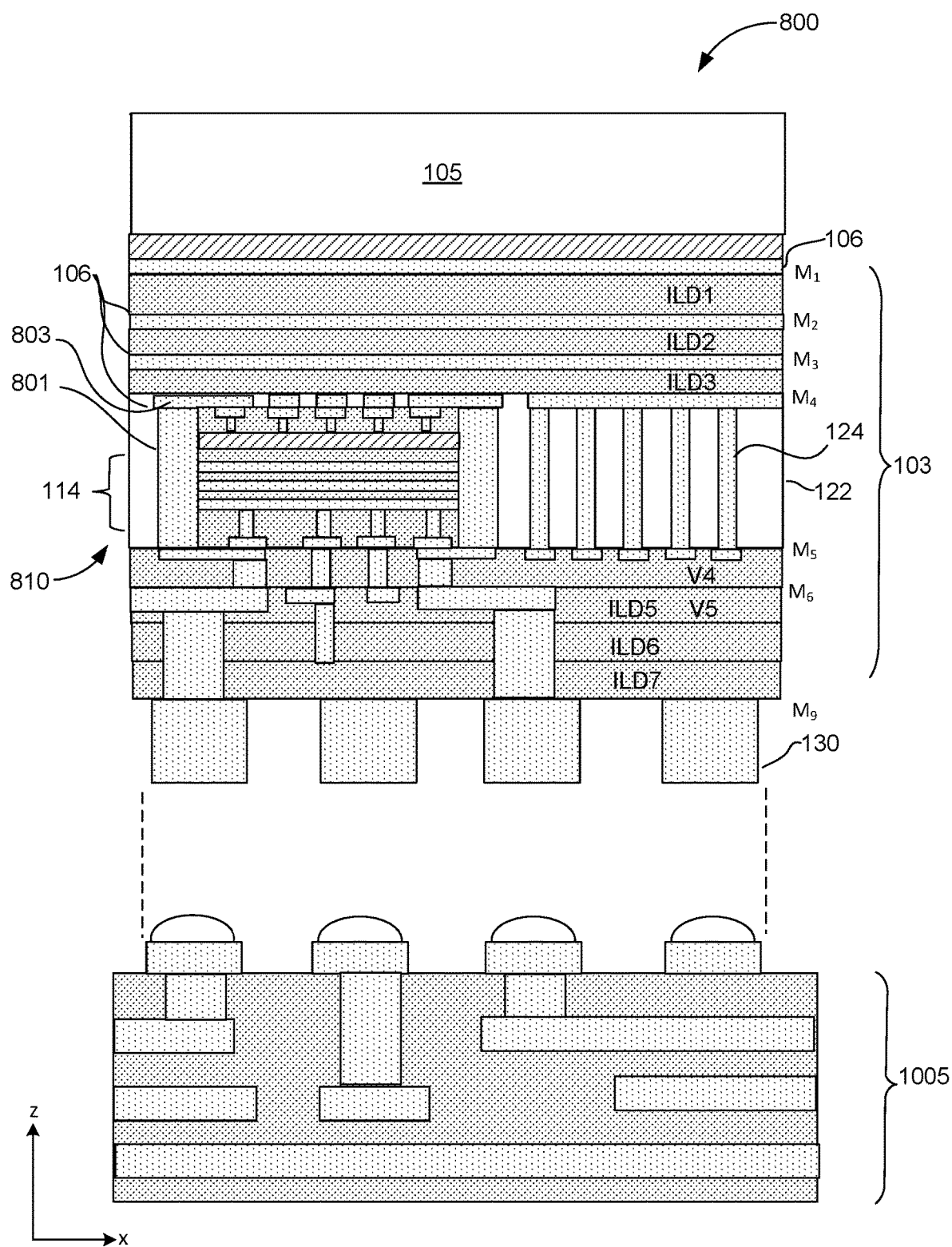
Figure 11:
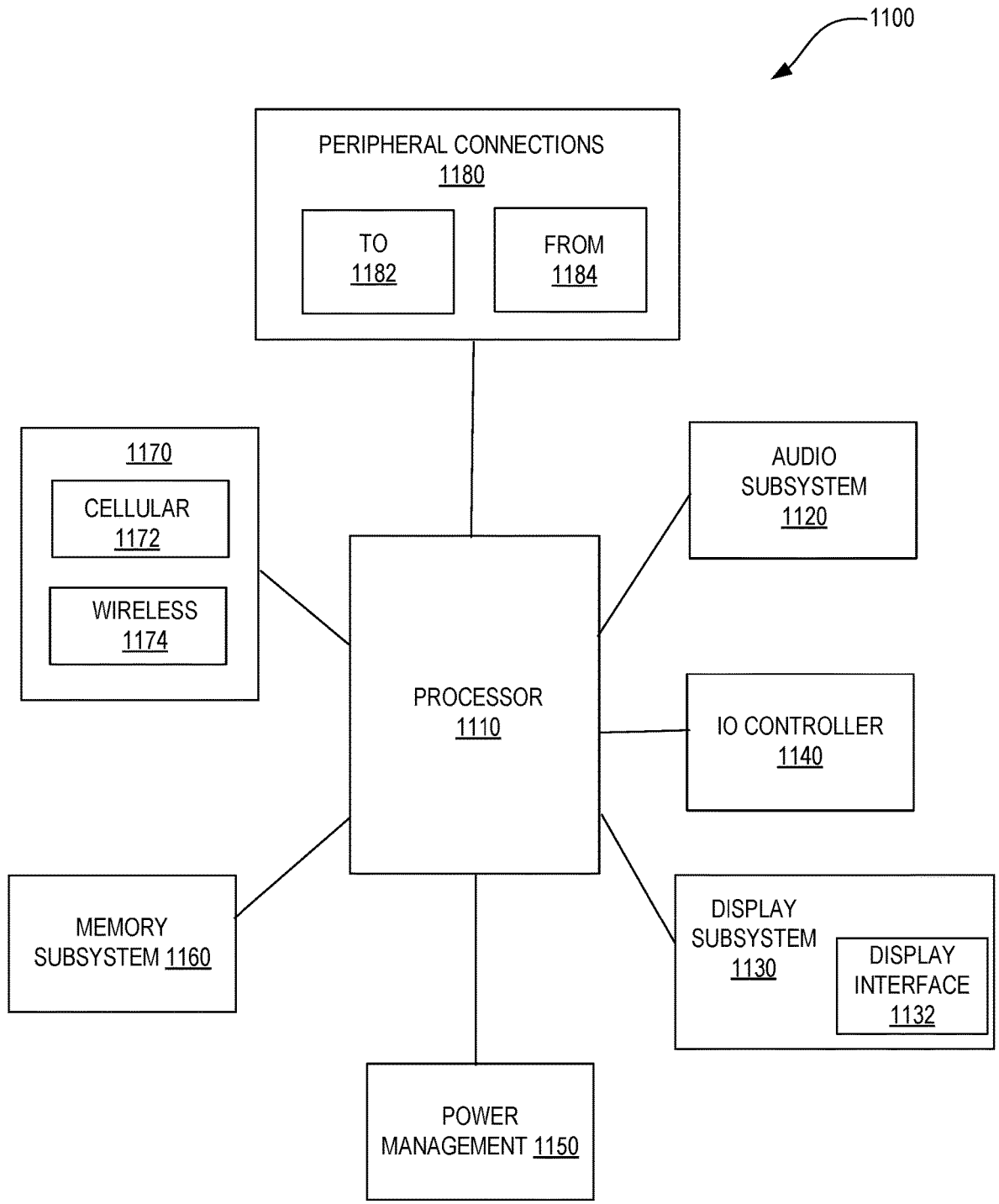
FIG. 11 illustrates a block diagram of a computing device as part of a system-on-chip (SoC) package comprising a composite chip structure in an implementation of a computing device, according to some embodiments of the disclosure.

FIG. 10E illustrates an exemplary completed BEOL stack 103 and interconnection to substrate 1005. During the creation of metallization level M5, interconnections 803 may be formed by through-mask etching between cantilever vias 801 to metal features 803 (e.g., power terminals) on top of chiplet 810. BEOL stack 103 may be completed to FLIs 130 on the top level by formation of higher metallization levels M6-M9 above chiplet 810. Cantilevered vias 801 may be coupled to power routing on a package substrate FIG. 11 illustrates a block diagram of computing device 1100 as part of a system-on-chip (SoC) package comprising a composite die (e.g., composite die 100) in an implementation of a computing device, according to some embodiments of the disclosure.

According to some embodiments, computing device 1100 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit. In some embodiments, the IC package comprises a composite die structure (e.g., any of composite dies 100, 200, 250, 700, 750, 760 or 800), comprising a chiplet die (e.g., any of chiplet dies 101, 701 or 810), according to the embodiments of the disclosure.

In some embodiments, computing device has wireless connectivity (e.g., Bluetooth, WiFi and 5G network). It will be understood that certain components are shown generally, and not all components of such a device are shown in computing device 1100.

The various embodiments of the present disclosure may also comprise a network interface within 1170 such as a wireless interface so that a system embodiment may be incorporated into a wireless device, for example, cell phone or personal digital assistant. The wireless interface includes a millimeter wave generator and antenna array.

According to some embodiments, processor 1110 represents a CPU or a GPU, and can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting the computing device 1100 to another device. The processing operations may also include operations related to audio I/O and/or display I/O.

In one embodiment, computing device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1100, or connected to the computing device 1100. In one embodiment, a user interacts with the computing device 1100 by providing audio commands that are received and processed by processor 1110

Display subsystem 1130 represents hardware (e.g., display devices) and software (e.g., drivers) components that provide a visual and/or tactile display for a user to interact with the computing device 1100. Display subsystem 1130 includes display interface 1132 which includes the particular screen or hardware device used to provide a display to a user. In one embodiment, display interface 1132 includes logic separate from processor 1110 to perform at least some processing related to the display. In one embodiment, display subsystem 1130 includes a touch screen (or touch pad) device that provides both output and input to a user.

I/O controller 1140 represents hardware devices and software components related to interaction with a user. I/O controller 1140 is operable to manage hardware that is part of audio subsystem 1120 and/or display subsystem 1130. Additionally, I/O controller 1140 illustrates a connection point for additional devices that connect to computing device 1100 through which a user might interact with the system. For example, devices that can be attached to the computing device 1100 might include microphone devices, speaker or stereo systems, video systems or other display devices, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of the computing device 1100. Additionally, audio output can be provided instead of, or in addition to display output. In another example, if display subsystem 1130 includes a touch screen, the display device also acts as an input device, which can be at least partially managed by I/O controller 1140. There can also be additional buttons or switches on the computing device 1100 to provide I/O functions managed by I/O controller 1140.

In one embodiment, I/O controller 1140 manages devices such as accelerometers, cameras, light sensors or other environmental sensors, or other hardware that can be included in the computing device 1100. The input can be part of direct user interaction, as well as providing environmental input to the system to influence its operations (such as filtering for noise, adjusting displays for brightness detection, applying a flash for a camera, or other features).

In one embodiment, computing device 1100 includes power management 1150 that manages battery power usage, charging of the battery, and features related to power saving operation. Memory subsystem 1160 includes memory devices for storing information in computing device 1100. Memory can include nonvolatile (state does not change if power to the memory device is interrupted) and/or volatile (state is indeterminate if power to the memory device is interrupted) memory devices. Memory subsystem 1160 can store application data, user data, music, photos, documents, or other data, as well as system data (whether long-term or temporary) related to the execution of the applications and functions of the computing device 1100.

Elements of embodiments are also provided as a machine-readable medium (e.g., memory 1160) for storing the computer-executable instructions. The machine-readable medium (e.g., memory 1160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1170 includes hardware devices (e.g., wireless and/or wired connectors and communication hardware) and software components (e.g., drivers, protocol stacks) to enable the computing device 1100 to communicate with external devices. The computing device 1100 could be separate devices, such as other computing devices, wireless access points or base stations, as well as peripherals such as headsets, printers, or other devices.

Network interface 1170 can include multiple different types of connectivity. To generalize, the computing device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1180 include hardware interfaces and connectors, as well as software components (e.g., drivers, protocol stacks) to make peripheral connections. It will be understood that the computing device 1100 could both be a peripheral device ("to" 1182) to other computing devices, as well as have peripheral devices ("from" 1184) connected to it. The computing device 1100 commonly has a "docking" connector to connect to other computing devices for purposes such as managing (e.g., downloading and/or uploading, changing, synchronizing) content on computing device 1100. Additionally, a docking connector can allow computing device 1100 to connect to certain peripherals that allow the computing device 1100 to control content output, for example, to audiovisual or other systems.

In addition to a proprietary docking connector or other proprietary connection hardware, the computing device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) device structure, comprising a host chip comprising a first device layer and a first metallization layer, a chiplet comprising a second device layer and a second metallization layer interconnected to transistors of the second device layer; and a top metallization layer comprising a plurality of first level interconnect (FLI) interfaces, wherein the chiplet is embedded between a first portion of the first device layer and the top metallization layer, and wherein the first portion of the first device layer is interconnected to the top metallization layer by one or more conductive vias extending through the second device layer or adjacent to an edge sidewall of the chiplet.

Example 2 includes all of the features of example 1, further comprising one or more second conductive vias that interconnect the first metallization layer to a backside of the second device layer.

Example 3 includes all of the features of examples 1 and 2, wherein the chiplet includes a third metallization layer on a side of the second device layer opposite the second metallization layer, and the one or more conductive vias extend through the second device layer and interconnect the second metallization layer to the third metallization layer.

Example 4 includes all of the features of example 3, further comprising a dielectric material over both the chiplet and a second portion of the first device layer adjacent to the chiplet, and wherein one or more additional conductive vias extend through the dielectric material and interconnect the first metallization layer to the second or third metallization layer.

Example 5 includes all of the features of any one of examples 1 through 4, further comprising a dielectric material substantially planar with a surface of the chiplet and over a second portion of the first device layer adjacent to the chiplet, and wherein one or more additional conductive vias extend through the dielectric material and interconnect the first metallization layer to the second portion of the first device layer.

Example 6 includes all of the features of any one of examples 1 through 5, further comprising a passive interconnect chiplet over a second portion of the first device layer, the passive interconnect chiplet comprising one or more metallization layers, and wherein a dielectric material is between a sidewall of the chiplet and a sidewall of the passive interconnect chiplet, and wherein metallization layers of the passive interconnect chiplet interconnect the first metallization layer to the second portion of the first device layer.

Example 7 includes all of the features of example 6, further comprising a second dielectric material over the chiplet and over the passive interconnect chiplet, and wherein one or more additional conductive vias extend through the second dielectric to interconnect the chiplet and the passive interconnect chiplet to the first metallization layer.

Example 8 includes all of the features of any one of examples 1 through 7, wherein the edge sidewall of the chiplet has a first length, and wherein the conductive vias comprise a via that is adjacent to the edge sidewall and that has a lateral dimension at least equal to half of the first length.

Example 9 includes all of the features of example 8, wherein the conductive vias comprise one or more vias adjacent to two or more intersecting edge sidewalls of the chiplet.

Example 10 includes all of the features of any one of examples 1 through 9, wherein the one or more vias adjacent to the two or more intersecting edge sidewalls comprises a single via that is adjacent to at least three edge sidewalls of the chiplet.

Example 11 includes all of the features of any one of examples 1 through 10, wherein the chiplet has a first thickness and the structure further comprises one or more thick metallization traces between the plurality of FLI interfaces and a second portion of the first device layer, adjacent to the first portion, and wherein the thick metallization traces have a thickness of at least half the first thickness.

Example 12 includes all of the features of example 11, wherein a top surface of the conductive vias are substantially planar with a top surface of the thick metallization trace.

Example 13 includes all of the features of any one of examples 1 through 12, further comprising a second chiplet embedded within the host chip between the first metallization layer and a second portion of the first device layer, adjacent to the first portion, wherein the second chiplet comprises a third device layer and one or more metallization layers interconnected to transistors of the third device layer, and wherein the top metallization layer is interconnected to the second portion of the first device layer through one or more additional vias that extend through the third device layer, or adjacent to an edge sidewall of the second chiplet.

Example 14 includes all of the features of example 13, wherein the first chiplet has a first thickness, and the second chiplet is spaced apart from the second portion of the first device layer by a thickness that is at least equal to the first thickness.

Example 15 is a system comprising a processing unit comprising a microprocessor coupled to a memory; and an integrated circuit (IC) device structure coupled to the processing unit, the IC device structure comprising a host chip comprising a first device layer and a first metallization layer a chiplet comprising a second device layer and a second metallization layer interconnected to transistors of the second device layer; and a top metallization layer comprising a plurality of first level interconnect (FLI) interfaces, wherein the chiplet is embedded between a first portion of the first device layer and the top metallization layer, and wherein the first portion of the first device layer is interconnected to the top metallization layer by one or more conductive vias extending through the second device layer or adjacent to an edge sidewall of the chiplet.

Example 16 includes all of the features of example 15, wherein the conductive vias interconnect a power port of the substrate with a power sink within the chip or chiplet.

Example 17 includes all of the features of examples 15 or 16, wherein the one or more vias interconnect a data port of the substrate to a data I/O of the chip or chiplet.

Example 18 is a method for fabricating an IC device structure, the method comprising forming a first metallization layer over a first and second portion of a first device layer; bonding to a chiplet over the first portion of the first device layer, the chiplet comprising a second device layer; forming one or more conductive vias through the second device layer or adjacent to an edge sidewall of the chiplet; and forming a top metallization layer over the chiplet and over the second portion of the first device layer, wherein the top metallization layer comprises a plurality of first level interconnect (FLI) interfaces.

An abstract is submitted with the understanding that it will not be used to limit the scope or meaning of the claims. The following claims are hereby incorporated into the detailed description, with each claim standing on its own as a separate embodiment.

We claim:

1. A method for fabricating an IC device structure, the method comprising:
    forming a first metallization layer over first and second regions of a first device layer;
    bonding a chiplet over the first region of the first device layer, the chiplet comprising a second device layer and a second metallization layer, wherein said bonding positions the second device layer between the first device layer and the second metallization layer;
    forming one or more conductive vias through the second device layer or adjacent to an edge sidewall of the chiplet; and
    forming a top metallization layer over the chiplet and over the second region of the first device layer, wherein the top metallization layer comprises a plurality of first level interconnect (FLI) interfaces.

2. The method of claim 1, further comprising forming one or more second conductive vias that interconnect the first metallization layer to a backside of the second device layer.

3. The method of claim 1, further comprising bonding a second chiplet between the top metallization layer and the second region of the first device layer, wherein the second chiplet comprises a third device layer and one or more third metallization layers interconnected to transistors of the third device layer, and wherein the top metallization layer is interconnected to the second region of the first device layer through one or more additional vias that extend through the third device layer or adjacent to an edge sidewall of the second chiplet.

4. The method of claim 3, wherein the chiplet has a first thickness, and the second chiplet is vertically spaced apart from the second region of the first device layer by a thickness that is at least equal to the first thickness.

5. The method of claim 3, further comprising bonding a passive interconnect chiplet between the second chiplet and the second region of the first device layer, the passive interconnect chiplet comprising one or more metallization layers to interconnect the second chiplet to the first metallization layer.

6. The method of claim 5, further comprising providing a dielectric material over the chiplet and between the passive interconnect chiplet and the second chiplet.

7. The method of claim 1, wherein bonding the chiplet over the first region of the first device layer comprises a hybrid bonding process.

8. The method of claim 1, further comprising forming one or more second conductive vias within a fill dielectric adjacent the chiplet and over the second region of the first device layer, wherein the one or more second conductive vias couple the second region of the first device layer to the top metallization layer.

9. The method of claim 8, further comprising forming a dielectric layer over the chiplet and the fill dielectric.

10. The method of claim 9, further comprising forming a plurality of third conductive vias within the dielectric layer, the third conductive vias to couple the one or more conductive vias to the top metallization layer.

11. A method for fabricating an IC device structure, the method comprising:
- forming a first metallization layer over first and second regions of a first device layer;
- bonding a chiplet over the first region of the first device layer, the chiplet comprising a second device layer;
- forming one or more conductive vias adjacent to an edge sidewall of the chiplet, wherein forming the one or more conductive vias adjacent to the edge sidewall of the chiplet comprises embedding the chiplet in a fill dielectric, forming a trench in the fill dielectric adjacent the edge sidewall, and filling the trench with a metal; and
- forming a top metallization layer over the chiplet and over the second region of the first device layer, wherein the top metallization layer comprises a plurality of first level interconnect (FLI) interfaces.

12. The method of claim 11, wherein the trench extends from the top of the fill dielectric to a top of a metallization structure of the first metallization layer.

13. The method of claim 11, wherein forming the trench comprises etching the trench through a hardmask aperture that at least partially encompasses the edge sidewall.

14. The method of claim 13, wherein a portion of the chiplet within the hardmask aperture comprise an etch stop material.

15. The method of claim 11, wherein forming the one or more conductive vias comprises forming a first conductive via adjacent to the edge sidewall and a second conductive via adjacent to a second edge sidewall of the chiplet opposite the edge sidewall, wherein the first and second conductive vias have differing widths in response to misalignment of the chiplet in a direction running between the edge sidewall and the second edge sidewall.

16. A method for fabricating an IC device structure, the method comprising:
- forming a first metallization layer over first and second regions of a first device layer;
- bonding a chiplet over the first region of the first device layer, the chiplet comprising a second device layer;
- forming one or more conductive vias adjacent to an edge sidewall of the chiplet, wherein a first conductive via of the one or more conductive vias is on the edge sidewall of the chiplet; and
- forming a top metallization layer over the chiplet and over the second region of the first device layer, wherein the top metallization layer comprises a plurality of first level interconnect (FLI) interfaces.

17. The method of claim 16, wherein the first conductive via is in contact with a metallization structure of the first metallization layer and a pad or trace on a top of the chiplet, the metallization structure extending between the first region and a bottom of the chiplet.

18. The method of claim 16, wherein the one or more conductive vias comprise a second conductive via adjacent to a second edge sidewall of the chiplet opposite the edge sidewall of the chiplet, wherein the first and second conductive vias have differing widths in response to misalignment of the chiplet in a direction running between the edge sidewall and the second edge sidewall.

19. The method of claim 16, wherein forming the one or more conductive vias adjacent to the edge sidewall of the chiplet comprises embedding the chiplet in a fill dielectric, forming a trench in the fill dielectric, and filling the trench with a metal.

\* \* \* \* \*